(12) United States Patent  
Cho

(10) Patent No.: US 9,893,069 B2  
(45) Date of Patent: Feb. 13, 2018

(54) SEMICONDUCTOR DEVICE HAVING BURIED GATE STRUCTURE AND METHOD OF FABRICATING THE SAME

(71) Applicant: SAMSUNG ELECTRONICS CO., LTD., Suwon-si, Gyeonggi-do (KR)

(72) Inventor: Min-Hee Cho, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/229,351

(22) Filed: Aug. 5, 2016

(65) Prior Publication Data

US 2016/0343714 A1 Nov. 24, 2016

Related U.S. Application Data

(63) Continuation of application No. 14/551,857, filed on Nov. 24, 2014, now Pat. No. 9,437,697.

(30) Foreign Application Priority Data

May 21, 2014 (KR) .................. 10-2014-0061198

(51) Int. Cl.
*H01L 29/66* (2006.01)
*H01L 27/108* (2006.01)
(Continued)

(52) U.S. Cl.
CPC .. *H01L 27/10823* (2013.01); *H01L 27/10814* (2013.01); *H01L 27/10855* (2013.01);
(Continued)

(58) Field of Classification Search
CPC ............. H01L 29/4236; H01L 29/7831; H01L 29/7827
See application file for complete search history.

(56) References Cited

U.S. PATENT DOCUMENTS 8,120,099 B2   2/2012   Seo et al.
8,637,927 B2   1/2014   Hwang et al.
(Continued)

FOREIGN PATENT DOCUMENTS

KR   1020110125385   11/2011

*Primary Examiner* — Dale E Page
*Assistant Examiner* — Wasiul Haider
(74) *Attorney, Agent, or Firm* — F. Chau & Associates, LLC

(57) ABSTRACT

A semiconductor device includes a device isolation region defining an active region in a substrate, and gate structures buried in the active region of the substrate. At least one of the gate structures includes a gate trench, a gate insulating layer conformally formed on an inner wall of the gate trench, a gate barrier pattern conformally formed on the gate insulating layer disposed on a lower portion of the gate trench, a gate electrode pattern formed on the gate barrier pattern and filling the lower portion of the gate trench, an electrode protection layer conformally formed on the gate insulating layer disposed on an upper portion of the gate trench to be in contact with the gate barrier pattern and the gate electrode pattern, a buffer oxide layer conformally formed on the electrode protection layer, and a gate capping insulating layer formed on the buffer oxide layer to fill the upper portion of the gate trench.

17 Claims, 31 Drawing Sheets

(51) Int. Cl.
  *H01L 29/423*    (2006.01)
  *H01L 29/78*     (2006.01)
  *H01L 29/49*     (2006.01)

(52) U.S. Cl.
  CPC .. *H01L 27/10876* (2013.01); *H01L 27/10885* (2013.01); *H01L 29/423* (2013.01); *H01L 29/4236* (2013.01); *H01L 29/4966* (2013.01); *H01L 29/78* (2013.01); *H01L 29/7827* (2013.01); *H01L 29/7831* (2013.01)

(56) References Cited

U.S. PATENT DOCUMENTS

| | | |
|---|---|---|
| 8,710,575 B1 | 4/2014 | Meiser et al. |
| 2010/0213541 A1 | 8/2010 | Jeon et al. |
| 2012/0086074 A1* | 4/2012 | Hwang ............. H01L 27/10876 257/334 |
| 2012/0119285 A1 | 5/2012 | Yang |
| 2013/0026637 A1* | 1/2013 | Hou ................. H01L 21/28088 257/770 |
| 2013/0037881 A1 | 2/2013 | Mizokuchi et al. |
| 2013/0052787 A1 | 2/2013 | Lee et al. |
| 2013/0328062 A1* | 12/2013 | Hisamoto ............... H01L 29/78 257/77 |
| 2014/0027813 A1* | 1/2014 | Kuruc ............... H01L 29/66348 257/139 |
| 2014/0064004 A1* | 3/2014 | Jang ................. H01L 29/66825 365/205 |
| 2015/0340453 A1 | 11/2015 | Cho |

\* cited by examiner

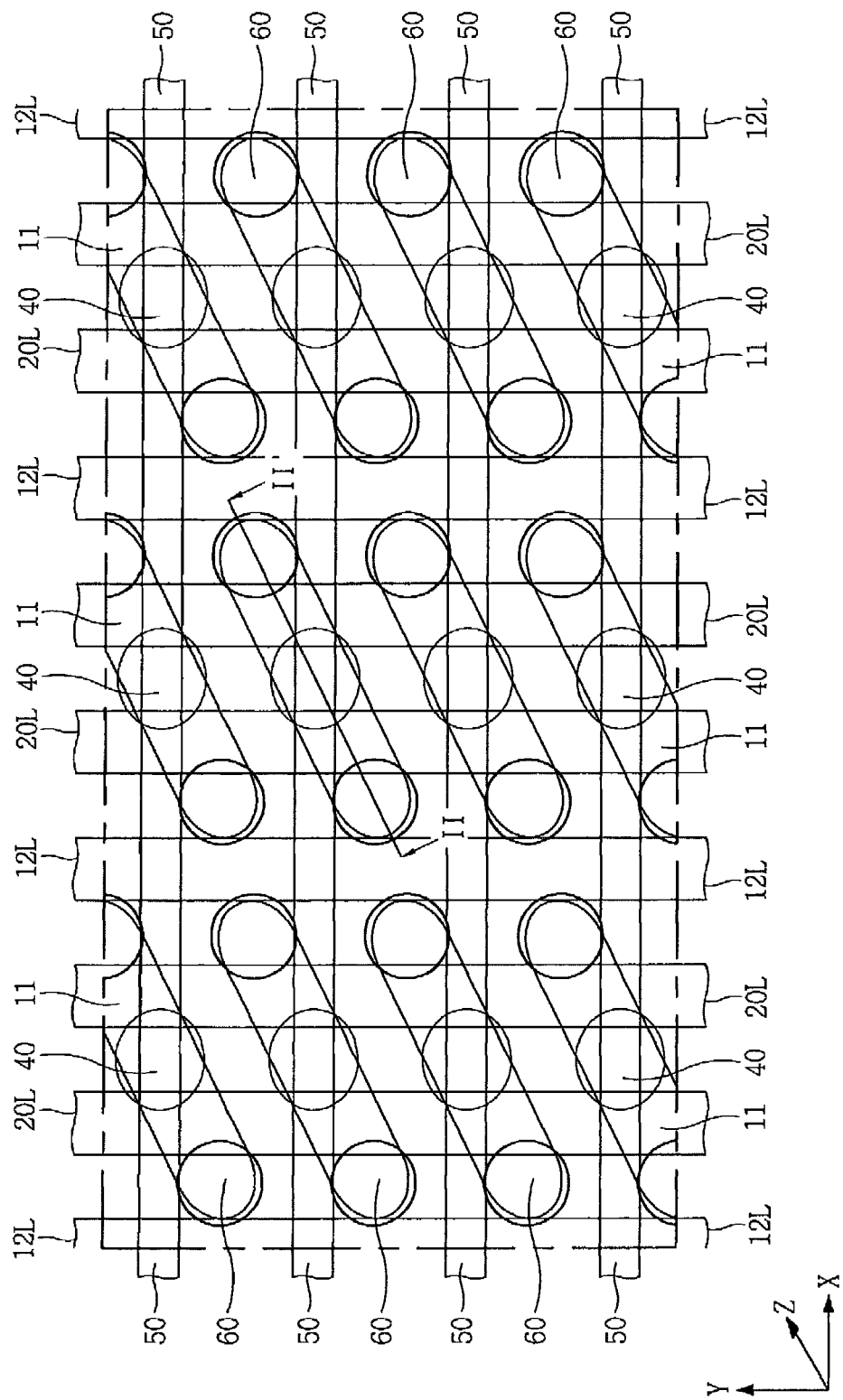

SEMICONDUCTOR DEVICE HAVING BURIED GATE STRUCTURE AND METHOD OF FABRICATING THE SAME

CROSS-REFERENCE TO RELATED APPLICATION

This application is a continuation of U.S. patent application Ser. No. 14/551,857, filed on Nov. 24, 2014, which claims priority under 35 U.S.C. §119 to Korean Patent Application No. 10-2014-0061198 filed on May 21, 2014, the disclosure of which is incorporated by reference herein in its entirety.

TECHNICAL FIELD

Exemplary embodiments of the present inventive concept relate to a semiconductor device having a buried gate structure and a method of fabricating the semiconductor device.

DISCUSSION OF RELATED ART

As a degree of integration of a semiconductor device gradually increases, a semiconductor device having a gate structure buried in a substrate has been proposed. Existing gate electrode structures of a buried channel array transistor (BCAT) structure include a conductive gate electrode pattern and a gate barrier pattern, which are formed at a lower portion of a gate trench, and a gate capping insulating layer formed at an upper portion of the gate trench. The gate capping insulating layer may be formed of a relatively hard insulating material, such as silicon nitride. Since a thermal expansion coefficient of silicon nitride may be significantly different from that of a silicon substrate, silicon nitride may cause a compressive stress to be applied to the silicon substrate during subsequent thermal processes.

SUMMARY

Embodiments of the present inventive concept provide a semiconductor device including a buried gate structure.

Exemplary embodiments of the present inventive concept provide a semiconductor device including a buried gate structure in which an upper end of a gate barrier pattern is recessed.

Exemplary embodiments of the present inventive concept provide a semiconductor device including a buried gate structure having a buffer oxide layer.

Exemplary embodiments of the present inventive concept provide a semiconductor device including a buried gate structure having a source area and drain areas formed by a diffusion method.

Exemplary embodiments of the present inventive concept provide a semiconductor device including a buried gate structure capable of reducing a compressive stress applied to an active region of a substrate.

Exemplary embodiments of the present inventive concept provide a method of fabricating a semiconductor device including a buried gate structure.

Exemplary embodiments of the present inventive concept provide a method of fabricating a semiconductor device including a buried gate structure in which an upper end of a gate barrier pattern is recessed.

Exemplary embodiments of the present inventive concept provide a method of fabricating a semiconductor device including a buried gate structure having a buffer oxide layer.

Exemplary embodiments of the present inventive concept provide a method of fabricating a semiconductor device including a buried gate structure having a source area and drain areas formed by a diffusion method.

Exemplary embodiments of the present inventive concept provide a method of fabricating a semiconductor device including a buried gate structure capable of reducing a compressive stress applied to an active region of a substrate.

In accordance with an aspect of the present inventive concept, a semiconductor device includes a device isolation region defining an active region in a substrate, and gate structures buried in the active region of the substrate. At least one of the gate structures includes a gate trench, a gate insulating layer conformally formed on an inner wall of the gate trench, a gate barrier pattern conformally formed on the gate insulating layer disposed on a lower portion of the gate trench, a gate electrode pattern formed on the gate barrier pattern and filling the lower portion of the gate trench, an electrode protection layer conformally formed on the gate insulating layer disposed on an upper portion of the gate trench to be in contact with the gate barrier pattern and the gate electrode pattern, a buffer oxide layer conformally formed on the electrode protection layer, and a gate capping insulating layer formed on the buffer oxide layer to fill the upper portion of the gate trench.

In accordance with an aspect of the present inventive concept, a semiconductor device includes gate structures buried in a substrate, a bit-line contact plug formed on the substrate to be vertically aligned with the substrate between the gate structures, a bit-line structure formed on the bit-line contact plug, and a spacer layer covering the bit-line structure.

In accordance with an aspect of the present inventive concept, a semiconductor device includes a device isolation region defining an active region in a substrate, gate structures buried in the active region of the substrate, a bit-line contact plug formed on the substrate to be vertically aligned with the active region between the gate structures, and a bit-line structure formed on the bit-line contact plug Further details of exemplary embodiments are included in the detailed description and drawings.

BRIEF DESCRIPTION OF THE DRAWINGS

The foregoing and other aspects of the present inventive concept will be apparent from the more particular description of embodiments of the inventive concept, as illustrated in the accompanying drawings in which like reference numerals may denote the same respective parts throughout the different views. The drawings are not necessarily to scale, emphasis instead being placed upon illustrating the principles of the inventive concept. In the drawings:

FIGS. 1A and 1B are layouts schematically showing semiconductor devices in accordance with embodiments of the inventive concept;

DETAILED DESCRIPTION OF THE EMBODIMENTS

Figure 1A:
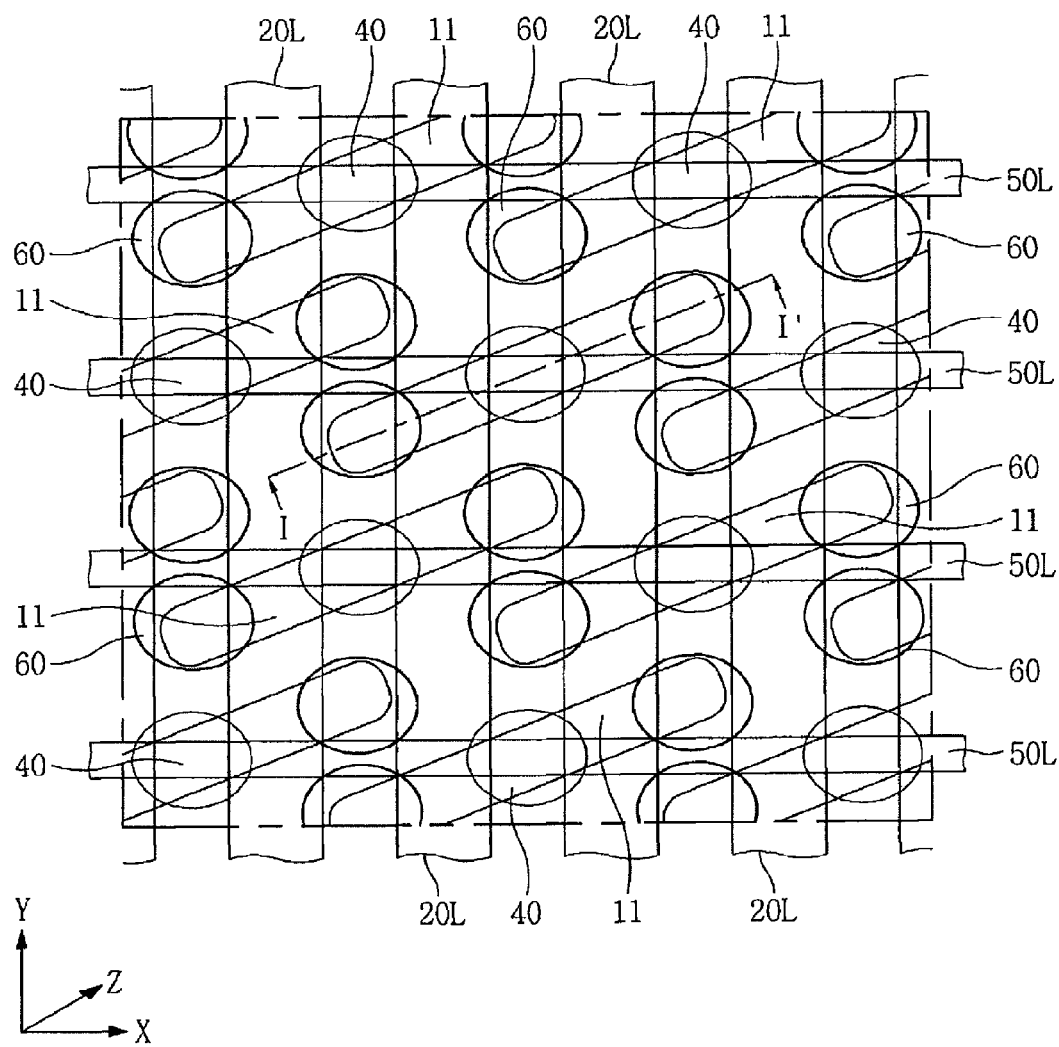

Various exemplary embodiments will now be described more fully with reference to the accompanying drawings in which some embodiments are shown. The inventive concept may, however, be embodied in different forms and should not be construed as limited to the embodiments set forth herein. Rather, the exemplary embodiments are provided so that this disclosure is thorough and complete and fully conveys the inventive concept to those skilled in the art.

The terminology used herein to describe embodiments of the inventive concept is not intended to limit the scope of the inventive concept. The articles "a," "an," and "the" are singular in that they have a single referent; however, the use of the singular form in the present document should not preclude the presence of more than one referent. In other words, elements of the inventive concept referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In the following explanation, the same reference numerals may denote the same components throughout the specification and drawings.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Exemplary embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Like numerals may refer to like elements throughout the specification and drawings. Accordingly, the same numerals and similar numerals can be described with reference to other drawings, even if not specifically described in a corresponding drawing. Further, when a numeral is not marked in a drawing, the numeral can be described with reference to other drawings.

FIGS. 1A and 1B are layouts schematically showing semiconductor devices in accordance with embodiments of the inventive concept.

Referring to FIGS. 1A and 1B, semiconductor devices 100 may include bit-lines 50L extending in an X-direction, gate lines 20L extending in a Y-direction perpendicular to the X-direction, and bar-shaped active regions 11 extending in a Z-direction diagonal to the X-direction and the Y-direction. The semiconductor devices 100 may include bit-line contact plugs 40 overlapping center areas of the active regions 11 intersecting the bit-lines 50L, and capacitor contact plugs 60 overlapping both ends of the active regions 11.

The active regions 11 may be arranged to be staggered from each other in the Y-direction as shown in FIG. 1A, or arranged in parallel as shown in FIG. 1B.

Referring further to FIG. 1B, device isolation lines 12L extending in the Y-direction to be parallel to the gate lines 20L may be further disposed between the active regions 11.

FIGS. 2A to 2F are vertical cross-sectional views taken along line I-I' of FIG. 1A or line II-II' of FIG. 1B for describing semiconductor devices 100A to 100F in accordance with embodiments of the inventive concept.

Figure 2A:
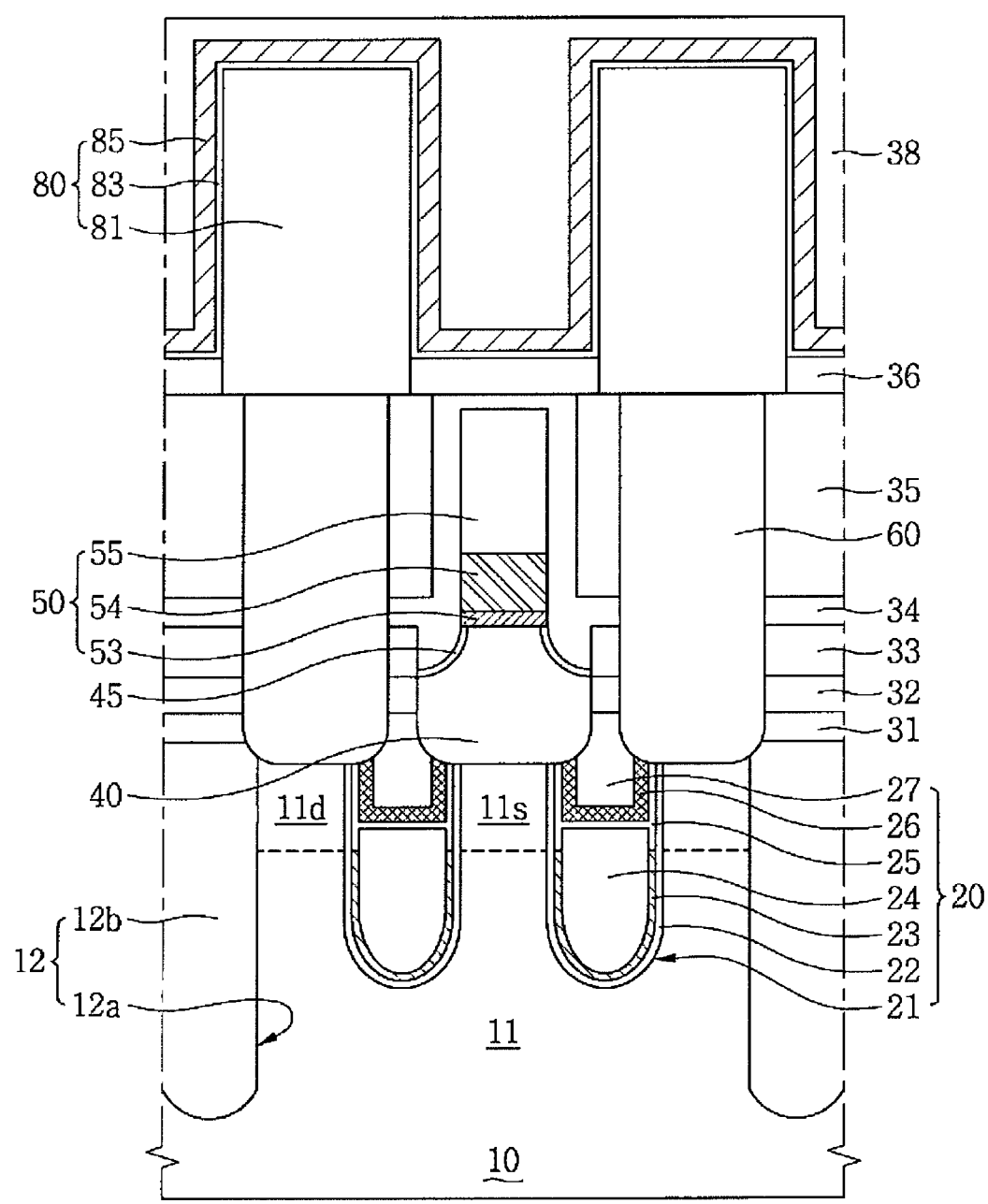
FIGS. 2A to 2F are vertical cross-sectional views taken along line I-I' of FIG. 1A or line II-II' of FIG. 1B for describing semiconductor devices in accordance with various embodiments of the inventive concept.

Referring to FIG. 2A, a semiconductor device 100A may include device isolation regions 12 formed in a substrate 10, gate structures 20, a bit-line structure 50, and capacitor structures 80. The semiconductor device 100A may include a bit-line contact plug 40 formed between the substrate 10 and the bit-line structure 50. The semiconductor device 100A may include capacitor contact plugs 60 formed between the substrate 10 and the capacitor structures 80. The semiconductor device 100A may include a lower interlayer insulating layer 32, a hole mask layer 33, a spacer layer 34, an upper interlayer insulating layer 35, an etch stop layer 36, and a capacitor capping insulating layer 38. The semiconductor device 100A may include a trench mask layer 31.

The device isolation regions 12 may include device isolation trenches 12a formed in the substrate 10, and a device isolation insulating material 12b filling the device isolation trenches 12a. The device isolation insulating material 12b may include silicon oxide. The device isolation regions 12 may define an active region 11. The active region 11 may include a source area 11s between the gate structures 20, and drain areas 11d between the gate structures 20 and the device isolation regions 12. The source area 11s and the drain areas 11d may include N-type impurities, such as phosphorus (P) and/or arsenic (As), respectively.

The gate structure 20 may include a gate insulating layer 22, a gate barrier pattern 23, a gate electrode pattern 24, an electrode protection layer 25, a buffer oxide layer 26, and a gate capping insulating layer 27 which are formed in a gate trench 21. The gate structures 20 may be buried in the active region 11 of the substrate 10.

The gate trench 21 may be formed from a surface of the substrate 10 toward the inside of the substrate 10.

The gate insulating layer 22 may be conformally formed on an entire inner wall of the gate trench 21. The gate insulating layer 22 may include, for example, silicon oxide, silicon nitride, silicon oxynitride, or a metal oxide. The metal oxide may include, for example, hafnium oxide, aluminum oxide, or titanium oxide.

The gate barrier pattern 23 may be conformally formed on the gate insulating layer 22. The gate barrier pattern 23 may be formed only on a lower portion of the gate trench 21. The gate barrier pattern 23 may include a barrier metal compound, such as, for example, titanium nitride (TiN) or tantalum nitride (TaN).

The gate electrode pattern 24 may be formed on the gate barrier pattern 23 to partially fill the gate trench 21. For example, the gate electrode pattern 24 may fill the lower portion of the gate trench 21. The gate electrode pattern 24 may include a metal, such as tungsten or copper.

An upper end of the gate barrier pattern 23 may be recessed to be lower than an upper end of the gate electrode pattern 24. When the upper end of the gate barrier pattern 23 is recessed, a distance between the gate electrode pattern 24 and the source area 11s and a distance between the gate electrode pattern 24 and the drain areas 11d may increase. Accordingly, a gate induced drain leakage (GIDL) current generated by turn-on of the gate structure 20 may decrease.

The electrode protection layer 25 may be conformally formed on the gate insulating layer 22 disposed on an upper portion of the gate trench 21. The electrode protection layer 25 may be formed on the upper end of the recessed gate barrier pattern 23. For example, a portion of the electrode protection layer 25 may be interposed between the gate electrode pattern 24 and the gate insulating layer 22. The electrode protection layer 25 may include silicon nitride. When the electrode protection layer 25 is interposed between the gate electrode pattern 24 and the buffer oxide layer 26, diffusion of oxygen atoms or oxygen ions from the buffer oxide layer 26 to the gate electrode pattern 24 may be reduced or prevented.

The buffer oxide layer 26 may be conformally formed on the electrode protection layer 25. The buffer oxide layer 26 may include silicon oxide. For example, the buffer oxide layer 26 may include a doped silicon oxide such as phosphorous silicate glass (PSG), or dopants such as, for example, phosphorous (P). The buffer oxide layer 26 may be a source for ion implantation. In an exemplary embodiment, the dopants included in the buffer oxide layer 26 may diffuse into the active region 11 during a manufacturing process and form the source area 11s and the drain areas 11d. Accordingly, when an ion-implantation process in which ions are physically implanted is excluded, physical damage to a surface of the active region 11 may be reduced or prevented, and a doping profile gradually changing according to a distance may be obtained.

The gate capping insulating layer 27 may be formed on the buffer oxide layer 26 to fill the gate trench 21. The gate capping insulating layer 27 may include silicon nitride.

The gate capping insulating layer 27 may apply a compressive stress to the active region 11 of the substrate 10. The buffer oxide layer 26 may reduce the compressive stress. Accordingly, reduction of N-type carrier mobility in the active region 11 due to the compressive stress may be mitigated.

When the buffer oxide layer 26 is softer and more flexible than the gate capping insulating layer 27, negative phenomena occurring due to a difference in thermal expansion coefficients between the substrate 10 and the gate capping insulating layer 27 may be reduced or prevented.

The bit-line contact plug 40 may be formed on the source area 11s of the active region 11 of the substrate 10. A bottom surface of the bit-line contact plug 40 may be located inside the substrate 10. For example, the bottom surface of the bit-line contact plug 40 may protrude downward to be lower than an upper surface of the substrate 10. Outer sides of the bottom surface of the bit-line contact plug 40 may be in contact with the gate structures 20. For example, a side of the bottom surface the bit-line contact plug 40 and/or a lower portion of a side surface of the bit-line contact plug 40 may be in contact with the gate insulating layer 22, electrode protection layer 25, buffer oxide layer 26, and gate capping insulating layer 27 of the gate structures 20. In other words, an upper surface of the source area 11s of the active region 11 in the substrate 10 may be recessed so that the bottom surface of the bit-line contact plug 40 is located inside the substrate 10. In an embodiment, upper surfaces of the gate insulating layer 22, the electrode protection layer 25, the buffer oxide layer 26, and the gate capping insulating layer 27 of the gate structures 20 may be partly recessed and slanted. For example, portions of the gate structures 20, which are exposed without being vertically aligned or overlapped with the bit-line structure 50, may be slanted forward. A side of an upper surface of the bit-line contact plug 40 may be recessed and slanted. When outer portions of the upper surface of the bit-line contact plug 40 are recessed, a short between the bit-line contact plug 40 and other conductive components may be reduced or prevented. A horizontal width of the bit-line contact plug 40 may be greater than a distance between the gate structures 20, that is, a horizontal width of the source area 11s. The bit-line contact plug 40 may electrically connect the source area 11s of the active region 11 in the substrate 10 to the bit-line structure 50.

A protection insulating layer 45 may be formed on the slanted surfaces of the bit-line contact plug 40. The protection insulating layer 45 may include silicon oxide, for example, a native oxide. The protection insulating layer 45 may reduce or prevent an electrical short between the bit-line contact plug 40 and the other conductive components, and protect the bit-line contact plug 40 from being damaged physically and chemically during a manufacturing process.

The trench mask layer 31 may be formed on the substrate 10 and/or the device isolation regions 12 to surround the side surfaces of the bit-line contact plug 40 and the capacitor contact plugs 60. Upper surfaces of the gate structures 20 and an upper surface of the trench mask layer 31 may be coplanar. The trench mask layer 31 may include silicon oxide or silicon nitride.

The lower interlayer insulating layer 32 may be formed on the trench mask layer 31 to surround the side surfaces of the bit-line contact plug 40 and the capacitor contact plugs 60. The lower interlayer insulating layer 32 may include silicon oxide or silicon nitride. For example, when the trench mask layer 31 and the lower interlayer insulating layer 32 are formed of the same material, a boundary between the trench mask layer 31 and the lower interlayer insulating layer 32 may disappear.

The bit-line structure 50 may include a bit-line barrier pattern 53, a bit-line electrode pattern 54, and a bit-line capping pattern 55. The bit-line barrier pattern 53 may be in contact with and electrically connected to the bit-line contact plug 40. The bit-line barrier pattern 53 may include a metal or a metal compound, such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN), or tungsten silicide (WSi). The bit-line electrode pattern 54 may include a metal, such as tungsten or copper. The bit-line capping pattern 55 may include silicon nitride. Sidewalls of the bit-line barrier pattern 53, the bit-line electrode pattern 54, and the bit-line capping pattern 55 may be vertically aligned.

The spacer layer 34 may surround the bit-line structure 50. For example, the spacer layer 34 may be conformally formed on top and side surfaces of the bit-line structure 50. The spacer layer 34 may cover the slantly recessed surfaces of the bit-line contact plug 40. The spacer layer 34 may horizontally extend onto the lower interlayer insulating layer 32. The spacer layer 34 may include silicon nitride.

The upper interlayer insulating layer 35 may surround side surfaces of the spacer layer 34. An upper surface of the spacer layer 34 and an upper surface of the upper interlayer insulating layer 35 may be coplanar.

The capacitor contact plugs 60 may be aligned to vertically pass through the upper interlayer insulating layer 35, the spacer layer 34, the lower interlayer insulating layer 32, and the trench mask layer 31 to be respectively connected to the drain areas 11*d* of the active region 11 in the substrate 10. Bottom surfaces of the capacitor contact plugs 60 may be located inside the substrate 10. Outer sides of the bottom surfaces of the capacitor contact plugs 60 may be in contact with the gate structures 20 and the device isolation regions 12. For example, the capacitor contact plugs 60 may be in contact with the gate insulating layer 22, the electrode protection layer 25, the buffer oxide layer 26, and the gate capping insulating layer 27 of the gate structures 20. In other words, upper surfaces of the drain areas 11*d* of the active region 11 in the substrate 10 may be recessed so that the bottom surfaces of the capacitor contact plugs 60 are located inside the substrate 10. In addition, upper surfaces of the gate insulating layer 22, the electrode protection layer 25, the buffer oxide layer 26, and the gate capping insulating layer 27 of the gate structures 20 may be partly recessed. Horizontal widths of the capacitor contact plugs 60 may be greater than a distance between the gate structures 20 and the device isolation regions 12, that is, horizontal widths of the drain areas 11*d*. The capacitor contact plugs 60 may electrically connect the drain areas 11*d* of the active region 11 in the substrate 10 to the capacitor structures 80, respectively. The upper surfaces of the spacer layer 34 and the upper interlayer insulating layer 35, and/or an upper surface of the capacitor contact plug 60 may be coplanar.

The etch stop layer 36 may be formed on the bit-line structure 50 and the upper interlayer insulating layer 35. The etch stop layer 36 may be formed on an upper portion of the bit-line structure 50, for example, on the bit-line capping pattern 55 or the spacer layer 34. The etch stop layer 36 may include, for example, silicon nitride.

Each of the capacitor structures 80 may include a capacitor lower electrode 81, a capacitor dielectric layer 83, and a capacitor upper electrode 85. The capacitor lower electrodes 81 may be electrically connected to and vertically aligned with the capacitor contact plugs 60, respectively. The capacitor lower electrode 81 may vertically pass through the etch stop layer 36. The capacitor lower electrode 81 may include a conductive material, such as a doped polysilicon, a metal, or a metal compound. The capacitor dielectric layer 83 may conformally cover a surface of the capacitor lower electrode 81. For example, the capacitor dielectric layer 83 may be formed on top and side surfaces of the capacitor lower electrode 81. The capacitor dielectric layer 83 may extend onto the etch stop layer 36. In other words, the capacitor dielectric layer 83 may be conformally formed on a surface of the etch stop layer 36. The capacitor dielectric layer 83 may include one of a metal oxide, such as hafnium oxide, aluminum oxide, titanium oxide, tantalum oxide, ruthenium oxide, and lanthanum oxide, silicon oxide, or silicon nitride. The capacitor upper electrode 85 may be conformally formed on the capacitor dielectric layer 83. The capacitor upper electrode 85 may include a metal or a metal compound.

The capacitor capping insulating layer 38 may fill a gap between the capacitor structures 80 and cover the capacitor structures 80. The capacitor capping insulating layer 38 may include silicon oxide.

As described above, when the upper end of the gate barrier pattern 23 is recessed to be lower than the upper end of the gate electrode pattern 24, the distance between the gate electrode pattern 24 and the source area 11*s* and the distance between the gate electrode pattern 24 and the drain areas 11*d* may increase. Accordingly, a GIDL current generated by turn-on of the gate structure 20 may decrease.

When the electrode protection layer 25 is interposed between the gate electrode pattern 24 and the buffer oxide layer 26, diffusion of oxygen atoms or oxygen ions from the buffer oxide layer 26 to the gate electrode pattern 24 to oxidize the gate electrode pattern 24 may be reduced or prevented.

When the buffer oxide layer 26 includes N-type dopants such as phosphorus (P), the source area 11*s* and the drain areas 11*d* may be formed using a diffusion process. When the buffer oxide layer 26 is softer and more flexible than the electrode protection layer 25 and the gate capping insulating layer 27, a compressive stress applied to the active region 11 from the gate capping insulating layer 27 may be reduced, and reduction of the N-type carrier mobility in the active region 11 may be reduced or prevented.

Figure 2B:
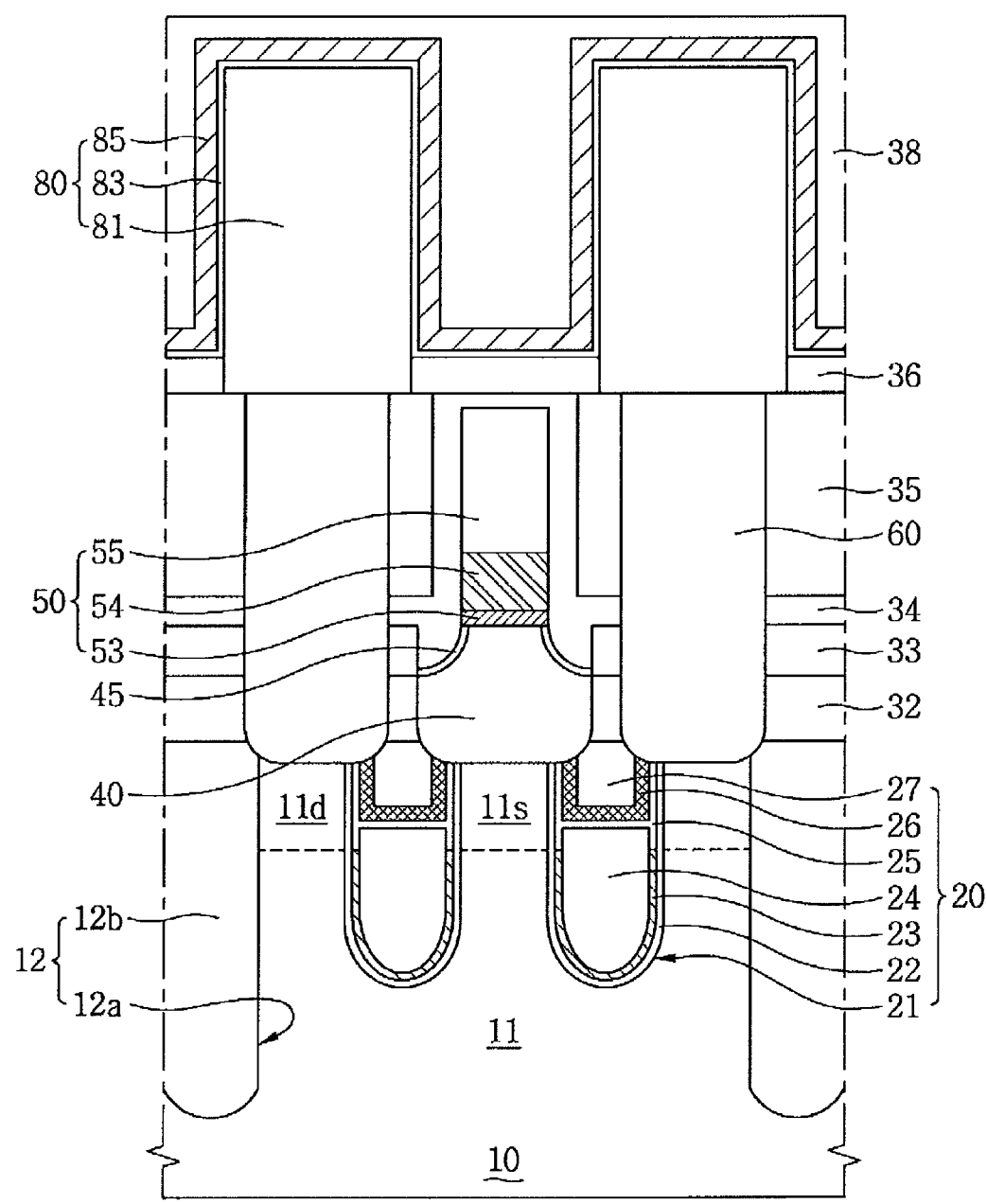

Referring to FIG. 2B, a semiconductor device 100B in accordance with an embodiment of the inventive concept may include device isolation regions 12 formed in a substrate 10, gate structures 20, a bit-line structure 50, and capacitor structures 80. The semiconductor device 100B may include a bit-line contact plug 40 formed between the substrate 10 and the bit-line structure 50. The semiconductor device 100B may include capacitor contact plugs 60 between the substrate 10 and the capacitor structures 80. The semiconductor device 100B may include a lower interlayer insulating layer 32, a hole mask layer 33, a spacer layer 34, an upper interlayer insulating layer 35, an etch stop layer 36, and a capacitor capping insulating layer 38. The lower interlayer insulating layer 32 may be formed, for example, directly on the substrate 10 and/or the device isolation regions 12. Components which are not described herein may be understood with reference to FIG. 2A.

Figure 2C:
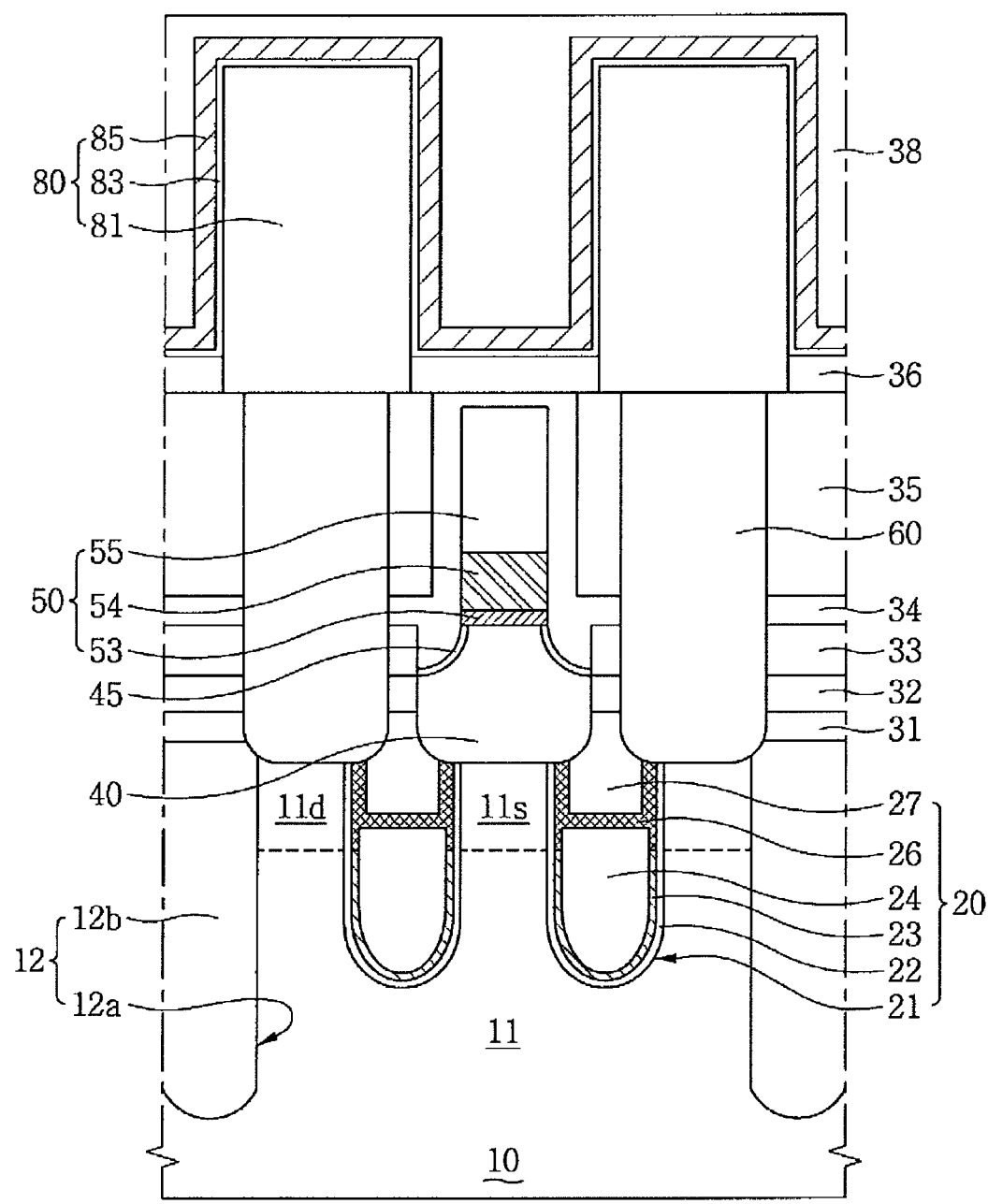

Referring to FIG. 2C, a semiconductor device 100C in accordance with an embodiment of the inventive concept may include device isolation regions 12 formed in a substrate 10, gate structures 20, a bit-line structure 50, and capacitor structures 80. The semiconductor device 100C may include a bit-line contact plug 40 formed between the substrate 10 and the bit-line structure 50. The semiconductor device 100C may include capacitor contact plugs 60 formed between the substrate 10 and the capacitor structures 80. The semiconductor device 100C may include a lower interlayer insulating layer 32, a hole mask layer 33, a spacer layer 34, an upper interlayer insulating layer 35, an etch stop layer 36, and a capacitor capping insulating layer 38. The semiconductor device 100C may include a trench mask layer 31.

The gate structures 20 may include a gate insulating layer 22, a gate barrier pattern 23, a gate electrode pattern 24, a buffer oxide layer 26, and a gate capping insulating layer 27 which are formed in a gate trench 21. The buffer oxide layer 26 may be directly and conformally formed on the gate insulating layer 22.

An upper end of the gate barrier pattern 23 may be recessed to be lower than an upper end of the gate electrode pattern 24. The buffer oxide layer 26 may be formed on the upper end of the recessed gate barrier pattern 23. For example, a portion of the buffer oxide layer 26 may be interposed between the gate electrode pattern 24 and the gate insulating layer 22. The buffer oxide layer 26 may contact the gate barrier pattern 23 and the gate electrode pattern 24. When the gate electrode pattern 24 includes an oxidation resistant metal, the electrode protection layer 25 shown in FIGS. 2A and 2B may be omitted.

Figure 2D:
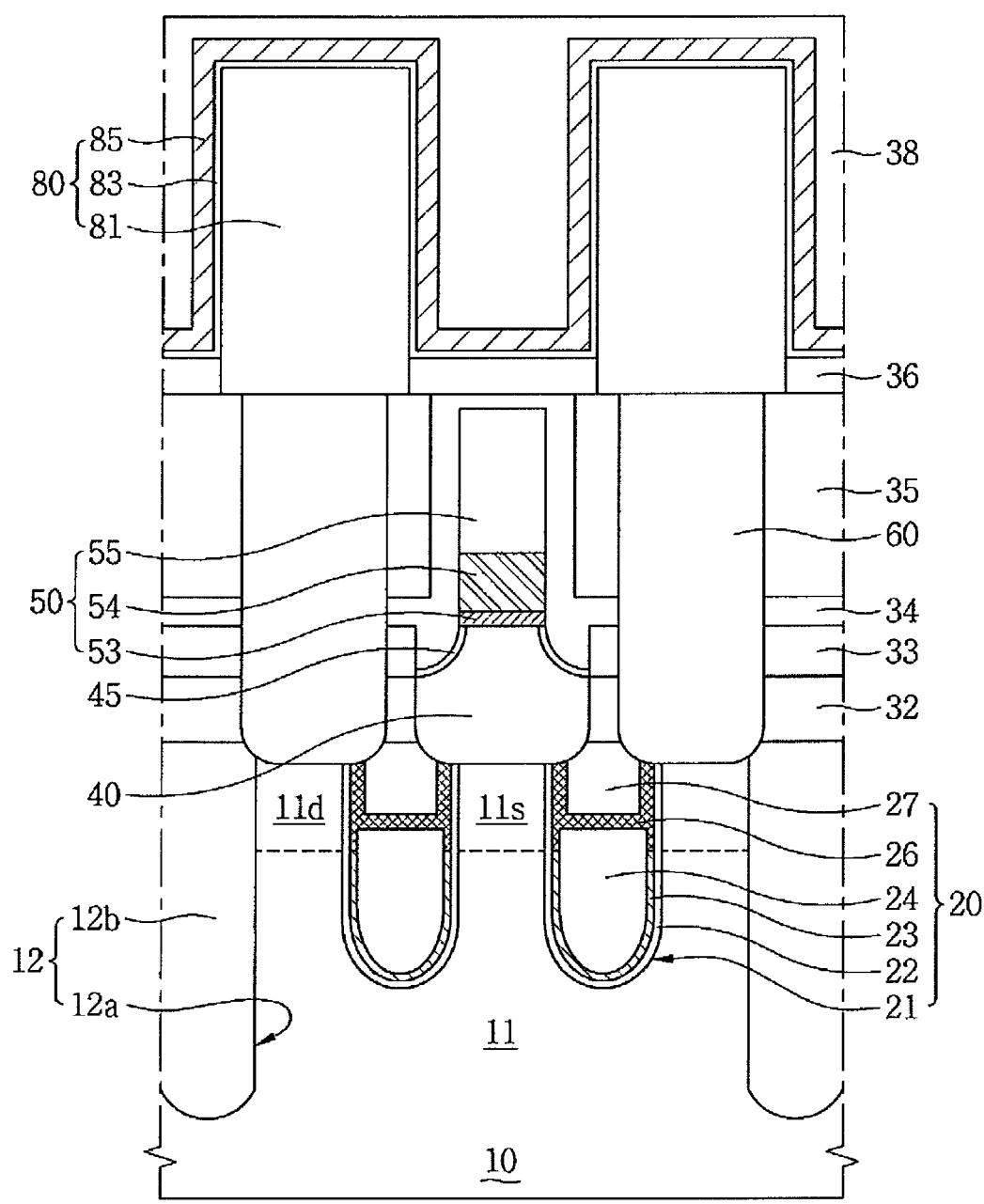

Referring to FIG. 2D, a semiconductor device 100D in accordance with an embodiment of the inventive concept may include device isolation regions 12 formed in a substrate 10, gate structures 20, a bit-line structure 50, and capacitor structures 80. The semiconductor device 100D may include a bit-line contact plug 40 formed between the substrate 10 and the bit-line structure 50. The semiconductor device 100D may include capacitor contact plugs 60 formed between the substrate 10 and the capacitor structures 80. The semiconductor device 100D may include a lower interlayer insulating layer 32, a hole mask layer 33, a spacer layer 34, an upper interlayer insulating layer 35, an etch stop layer 36, and a capacitor capping insulating layer 38.

The gate structures 20 may include a gate insulating layer 22, a gate barrier pattern 23, a gate electrode pattern 24, a buffer oxide layer 26, and a gate capping insulating layer 27 which are formed in a gate trench 21. The buffer oxide layer 26 may be directly and conformally formed on the gate insulating layer 22. The buffer oxide layer 26 may contact the gate barrier pattern 23 and the gate electrode pattern 24. When the gate electrode pattern 24 includes an oxidation resistant metal, the electrode protection layer 25 shown in FIGS. 2A and 2B may be omitted.

The lower interlayer insulating layer 32 may be formed, for example, directly on the substrate 10 and/or the device isolation regions 12.

Figure 2E:
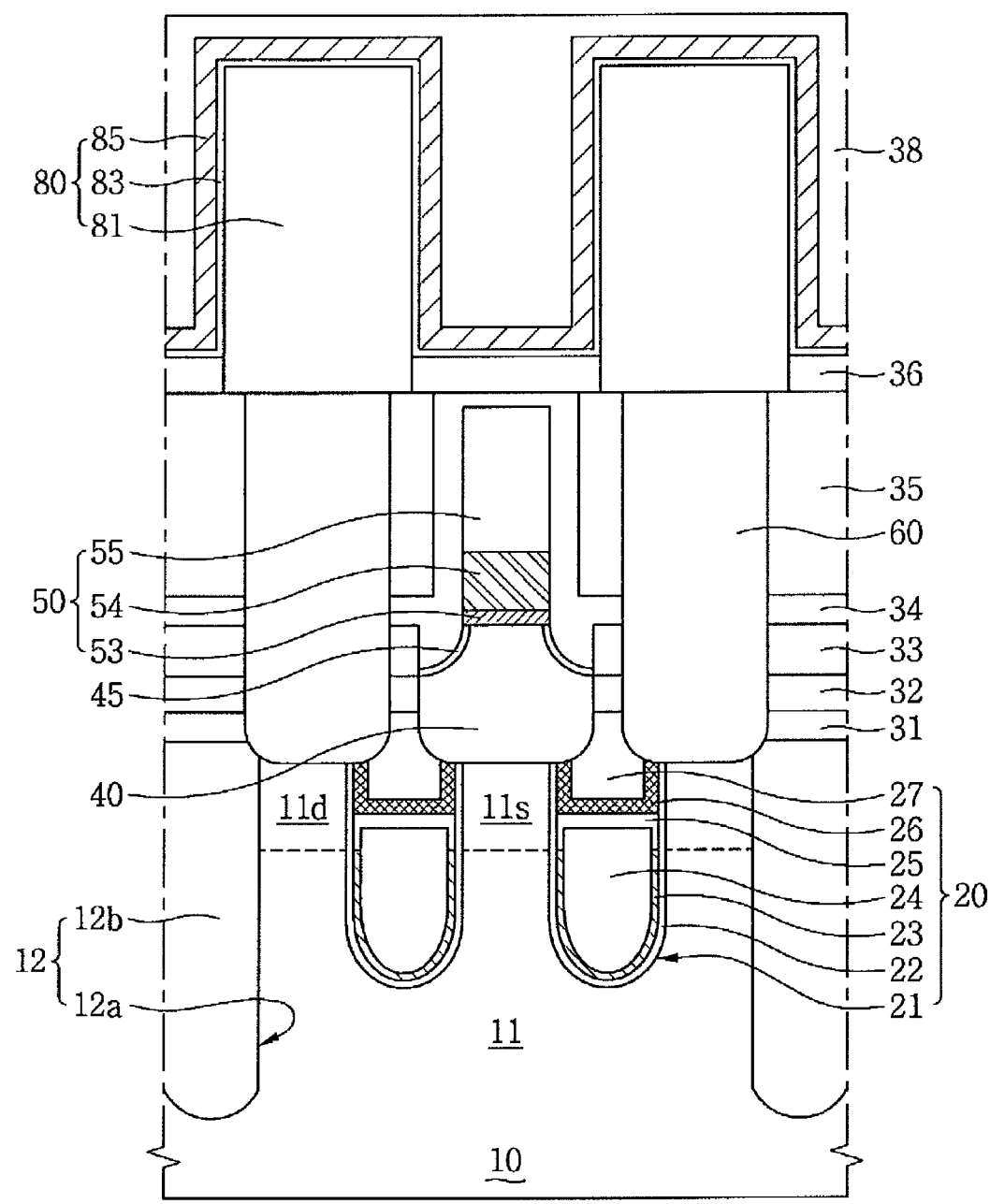

Referring to FIG. 2E, a semiconductor device 100E in accordance with an embodiment of the inventive concept may include device isolation regions 12 formed in a substrate 10, gate structures 20, a bit-line structure 50, and capacitor structures 80. The semiconductor device 100E may include a bit-line contact plug 40 formed between the substrate 10 and the bit-line structure 50. The semiconductor device 100E may include capacitor contact plugs 60 formed between the substrate 10 and the capacitor structures 80. The semiconductor device 100E may include a lower interlayer insulating layer 32, a hole mask layer 33, a spacer layer 34, an upper interlayer insulating layer 35, an etch stop layer 36, and a capacitor capping insulating layer 38. The semiconductor device 100E may include a trench mask layer 31.

The gate structures 20 may include a gate insulating layer 22, a gate barrier pattern 23, a gate electrode pattern 24, an electrode protection layer 25, a buffer oxide layer 26, and a gate capping insulating layer 27 which are formed in a gate trench 21. An upper end of the gate barrier pattern 23 may be recessed to be lower than an upper end of the gate electrode pattern 24.

The electrode protection layer 25 may be interposed between the gate electrode pattern 24 and the buffer oxide layer 26. The electrode protection layer 25 may have a substantially planar surface. The electrode protection layer 25 may cover an upper surface of the gate electrode pattern 24, and may be disposed on the recessed gate barrier pattern 23 interposed between the gate insulating layer 22 and the gate electrode pattern 24. For example, the electrode protection layer 25 need not be substantially formed on the gate insulating layer 22 disposed on sidewalls of the gate trench 21.

The buffer oxide layer 26 may be directly and conformally formed on the gate insulating layer 22 disposed on the sidewalls of the gate trench 21. The buffer oxide layer 26 need not be in contact with the gate barrier pattern 23 and the gate electrode pattern 24.

The gate capping insulating layer 27 may be in contact with the gate insulating layer 22 at an upper portion of the gate trench 21.

Figure 2F:
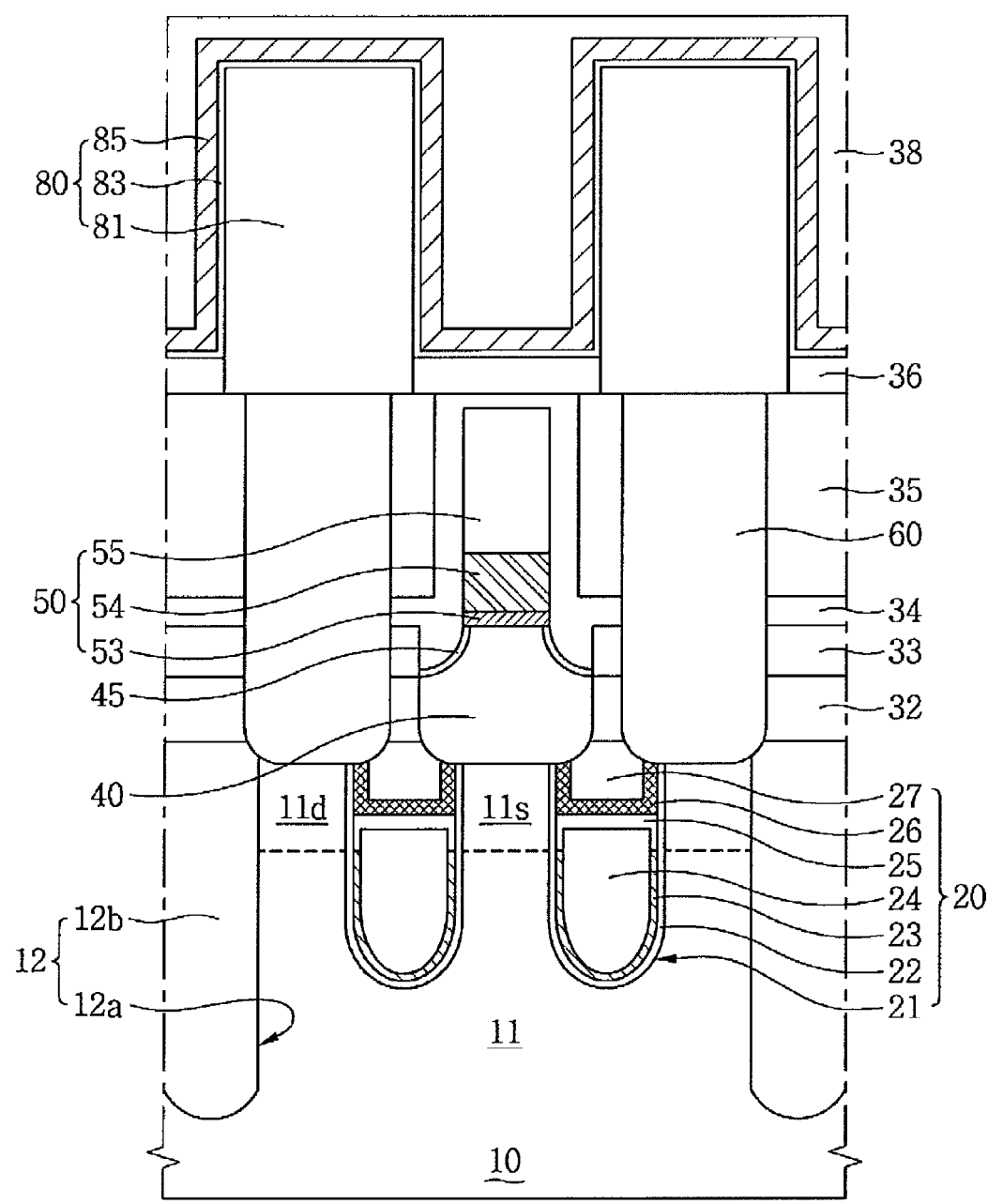

Referring to FIG. 2F, a semiconductor device 100F in accordance with an embodiment of the inventive concept may include device isolation regions 12 formed in a substrate 10, gate structures 20, a bit-line structure 50, and capacitor structures 80. The semiconductor device 100F may include a bit-line contact plug 40 formed between the substrate 10 and the bit-line structure 50. The semiconductor device 100F may include capacitor contact plugs 60 formed between the substrate 10 and the capacitor structures 80. The semiconductor device 100F may include a lower interlayer insulating layer 32, a hole mask layer 33, a spacer layer 34, an upper interlayer insulating layer 35, an etch stop layer 36, and a capacitor capping insulating layer 38.

The gate structures 20 may include a gate insulating layer 22, a gate barrier pattern 23, a gate electrode pattern 24, a buffer oxide layer 26, and a gate capping insulating layer 27 which are formed in a gate trench 21.

An upper end of the gate barrier pattern 23 may be recessed to be lower than an upper end of the gate electrode pattern 24.

The electrode protection layer 25 may be interposed between the gate electrode pattern 24 and the buffer oxide layer 26. The electrode protection layer 25 may have a substantially planar surface. The electrode protection layer 25 may cover an upper surface of the gate electrode pattern 24, and may be disposed on the recessed gate barrier pattern 23 interposed between the gate insulating layer 22 and the gate electrode pattern 24. For example, the electrode protection layer 25 need not be substantially formed on the gate insulating layer 22 disposed on sidewalls of the gate trench 21.

In an embodiment, the buffer oxide layer 26 may be directly and conformally formed on the gate insulating layer 22 disposed on the sidewalls of the gate trench 21. The buffer oxide layer 26 need not be in contact with the gate barrier pattern 23 and the gate electrode pattern 24 according to an embodiment.

The gate capping insulating layer 27 may be in contact with the gate insulating layer 22 at an upper portion of the gate trench 21.

The lower interlayer insulating layer 32 may be directly formed on the substrate 10 and/or the device isolation regions 12.

In the semiconductor devices 100E and 100F described in FIGS. 2E and 2F, an area in which the electrode protection layer 25 is in contact with the sidewalls of the gate trench 21 is minimized, and a compressive stress applied to the source area 11s and drain areas 11d of the active region 11 by the electrode protection layer 25 may be minimized.

Figure 3A:
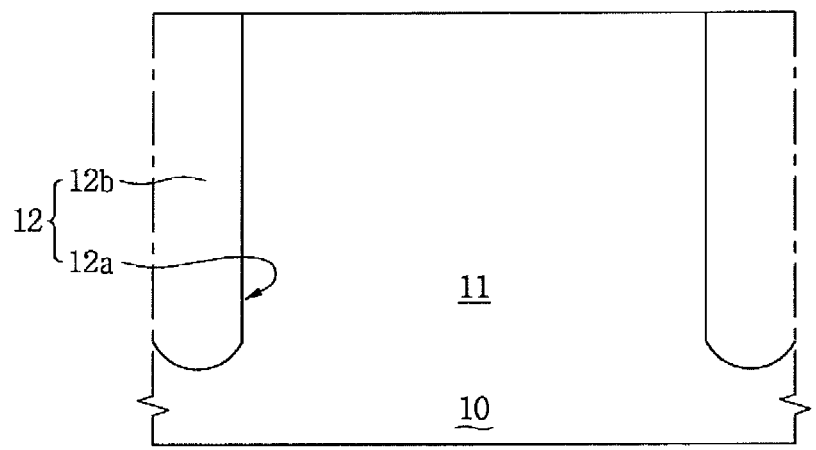
FIGS. 3A to 8 are vertical cross-sectional views taken along line I-I' of FIG. 1A or line II-II' of FIG. 1B for describing methods of fabricating semiconductor devices in accordance with various embodiments of the inventive concept.

FIGS. 3A to 3O are vertical cross-sectional views taken along line I-I' of FIG. 1A or line II-II' of FIG. 1B for describing a method of fabricating a semiconductor device in accordance with an embodiment of the inventive concept.

Referring to FIG. 3A, a method of fabricating a semiconductor device 100A in accordance with an embodiment of the inventive concept may include forming device isolation regions 12 defining an active region 11 in a substrate 10 by performing a shallow trench isolation (STI) process, for example. The STI process may include forming a device isolation trench 12a in the substrate 10 and filling the device isolation trench 12a with a device isolation insulating material 12b such as silicon oxide.

Figure 3B:
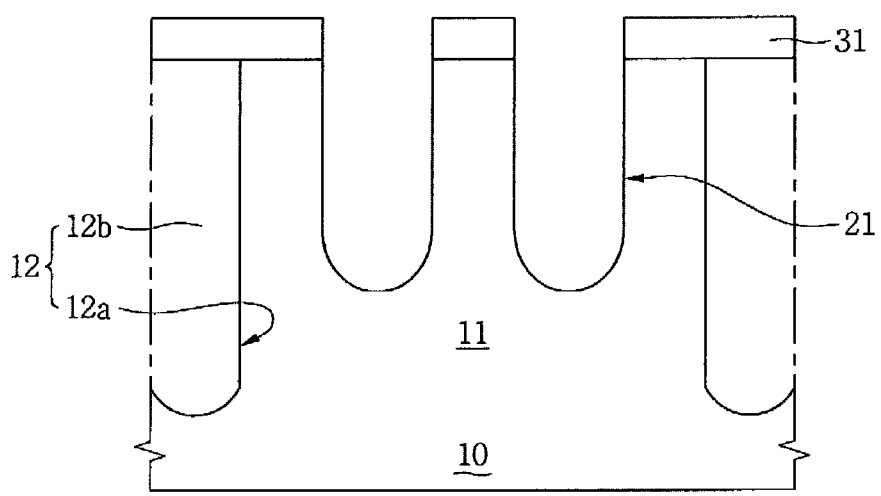

Referring to FIG. 3B, the method may include forming a trench mask layer 31 on the substrate 10, and forming gate trenches 21 in the substrate 10 by performing an etching process using the trench mask layer 31 as an etch mask. The trench mask layer 31 may include a relatively dense silicon oxide, such as silicon oxide formed in a high density plasma (HDP) process.

Figure 3C:
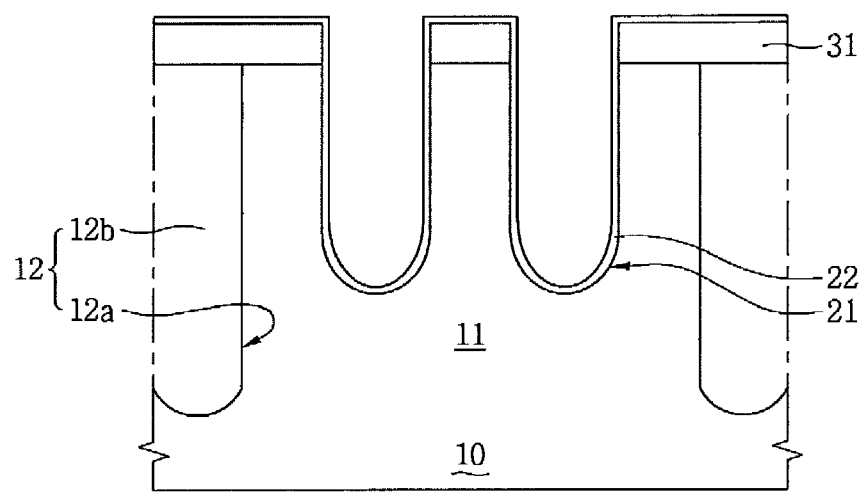

Referring to FIG. 3C, the method may include conformally forming a gate insulating layer 22 on inner walls of the gate trenches 21 and a surface of the trench mask layer 31. The gate insulating layer 22 may include silicon oxide or a metal oxide. The metal oxide may include hafnium oxide, aluminum oxide, or titanium oxide. The gate insulating layer 22 may be formed using, for example, an atomic layered deposition (ALD) process and/or a thermal oxidation process. When the gate insulating layer 22 is formed using a thermal oxidation process, the gate insulating layer 22 need not be formed on a surface of the trench mask layer 31.

Figure 3D:
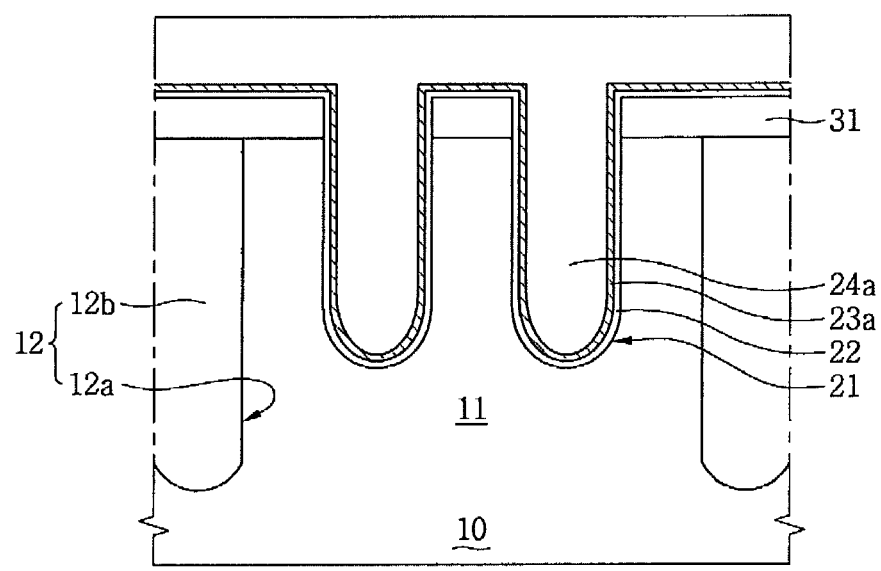

Referring to FIG. 3D, the method may include conformally forming a gate barrier layer 23a on the gate insulating layer 22 and forming a gate electrode layer 24a filling the gate trench 21 on the gate barrier layer 23a. The gate barrier layer 23a may be formed by performing an ALD process. The gate electrode layer 24a may be formed by performing an ALD or chemical vapor deposition (CVD) process. The gate barrier layer 23a may include a barrier metal compound, such as titanium nitride TiN or tantalum nitride TaN. The gate electrode layer 24a may include a metal such as tungsten or copper.

Figure 3E:
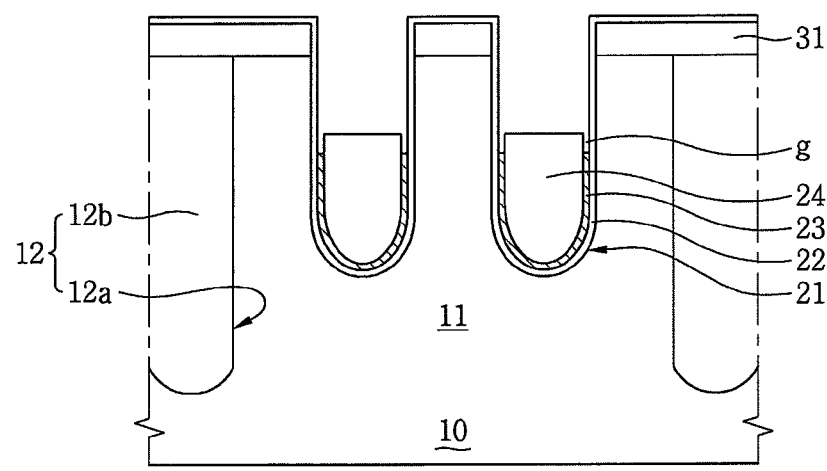

Referring to FIG. 3E, the method may include forming a gate electrode pattern 24 and a gate barrier pattern 23 by partially removing upper portions of the gate barrier layer 23a and the gate electrode layer 24a in the gate trench 21 by performing an etch back process. An upper surface of the gate electrode pattern 24 may be located at a higher level than an upper end of the gate barrier pattern 23. In other words, the upper end of the gate barrier pattern 23 may be recessed to be lower than the upper surface of the gate electrode pattern 24. Accordingly, a gap g may be formed between the gate insulating layer 22 and the gate electrode pattern 24.

The etch back process may include a wet etching process. The wet etching process may be executed one or two times using an etching solution including a first etchant by which the gate electrode layer 24a is mainly removed and a second etchant by which the gate barrier layer 23a is mainly etched. For example, the wet etching process may include performing a first etching process using an etching solution including the first etchant, and subsequently performing a second etching process using an etching solution including the second etchant. The first etchant may include water, hydrogen peroxide ($H_2O_2$), and/or ammonium ($NH_4$). The second etchant may include water and sulfuric acid ($H_2SO_4$). The second etchant may include $H_2O_2$ and/or $NH_4$.

Figure 3F:
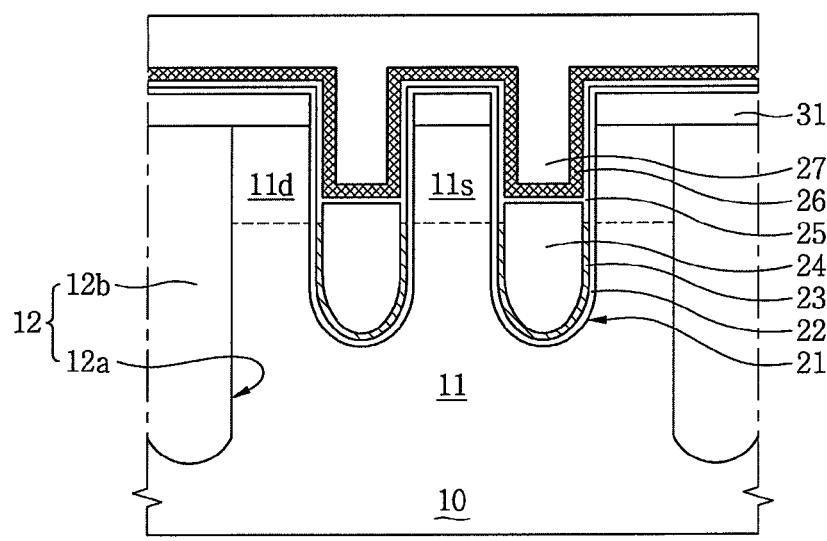

Referring to FIG. 3F, the method may include forming an electrode protection layer 25 on the gate insulating layer 22 and the gate electrode pattern 24 in the gate trench 21, forming a buffer oxide layer 26 on the electrode protection layer 25, and forming a gate capping insulating layer 27 on the buffer oxide layer 26.

The electrode protection layer 25 may fill the gap g. The electrode protection layer 25 may also be formed on the trench mask layer 31. The electrode protection layer 25 may be conformally formed using an ALD process. The electrode protection layer 25 may include silicon nitride.

The buffer oxide layer 26 may be conformally formed using an ALD process. The buffer oxide layer 26 may include a dopant. The dopant may sufficiently include N-type impurities, such as phosphorus (P) or arsenic (As), for example, phosphosilicate glass (PSG) and an N-doped oxide. For example, the buffer oxide layer 26 may include phosphorus (P) up to about 20% of a total weight or a volume thereof. The buffer oxide layer 26 need not substantially include P-type impurities such as boron (B).

The gate capping insulating layer 27 may fully fill the gate trench 21. The gate capping insulating layer 27 may include silicon nitride.

In an embodiment, the method may include forming a source area 11s and drain areas 11d by performing a thermal annealing process. The source area 11s and the drain areas 11d may be formed in such a manner that the dopant in the buffer oxide layer 26 is diffused into the substrate 10. The source area 11s and the drain areas 11d formed by the diffusion process may have a gradient dopant concentration according to a distance (from a surface of the substrate 10), and may thereby have stable electrical properties. When an ion-implantation process by which the active region 11 is physically damaged is not performed, the source area 11s and the drain areas 11d may retain their physical and electrical properties.

When the gate capping insulating layer 27 and/or the electrode protection layer 25 include(s) silicon nitride, the gate capping insulating layer 27 may apply a compressive stress to the substrate 10. When the buffer oxide layer 26 is more flexible than the gate capping insulating layer 27 and the electrode protection layer 25, the compressive stress may be mitigated. When the compressive stress is applied to the substrate 10, electron mobility in the substrate 10 may be lowered. When the buffer oxide layer 26 reduces the compressive stress, reduction of the electron mobility may be mitigated.

Figure 3G:
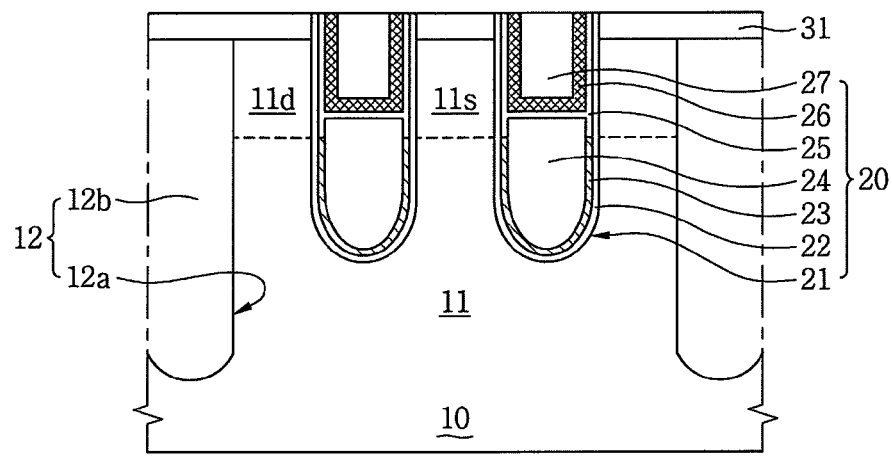

Referring to FIG. 3G, the method may include removing the gate capping insulating layer 27, the buffer oxide layer 26, and the electrode protection layer 25 which are disposed on the trench mask layer 31 by performing a planarization process, and forming a gate structure 20 including the gate insulating layer 22, the gate barrier pattern 23, the gate electrode pattern 24, the electrode protection layer 25, the buffer oxide layer 26, and the gate capping insulating layer 27 which are formed in the gate trench 21. The planarization process may include a chemical mechanical polishing (CMP) process. An upper surface of the trench mask layer 31 may be exposed.

Figure 3H:
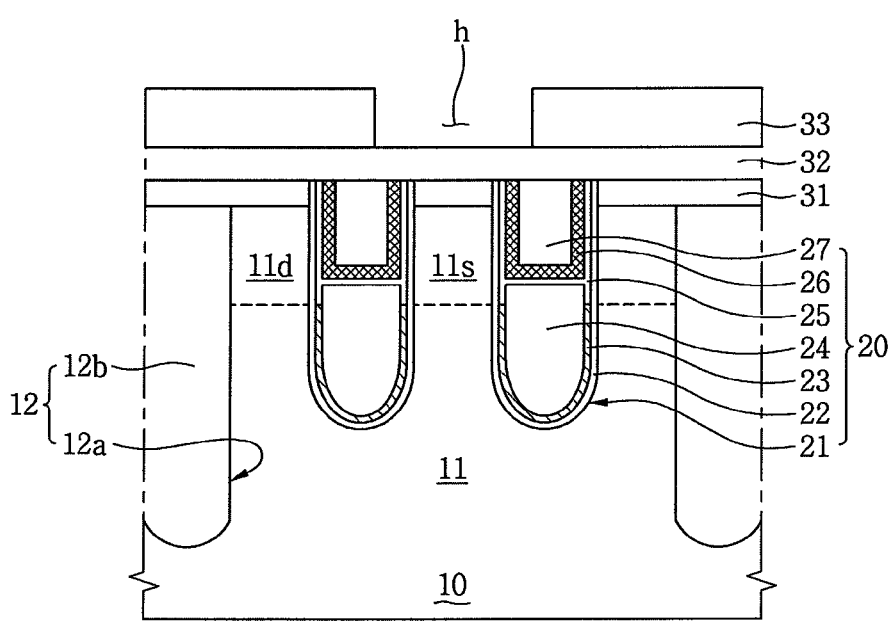

Referring to FIG. 3H, the method may include forming a lower interlayer insulating layer 32 and a hole mask layer 33 on the gate structure 20 and the trench mask layer 31. The lower interlayer insulating layer 32 may include silicon oxide. The hole mask layer 33 may include silicon nitride. The hole mask layer 33 may include a hole h vertically aligned with the source area 11s of the active region 11 disposed between the gate structures 20.

Figure 3I:
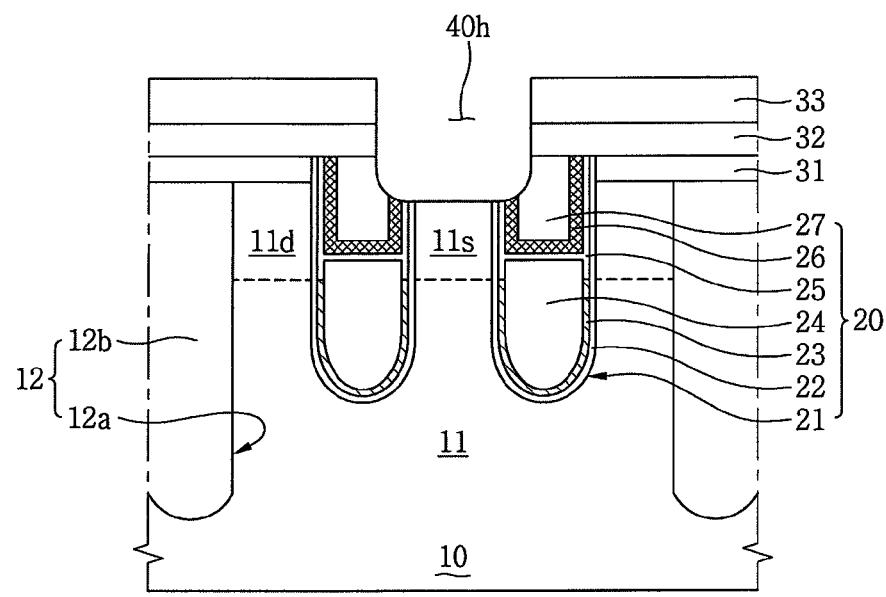

Referring to FIG. 3I, the method may include forming a bit-line contact hole 40h vertically aligned with the hole h and exposing the source area 11s of the active region 11 in the substrate 10 by performing an etching process using the hole mask layer 33 as an etch mask. A bottom surface of the bit-line contact hole 40h may be recessed to be lower than a surface of the substrate 10. The hole mask layer 33 may become thinner. During the etching process, the gate capping insulating layer 27, the buffer oxide layer 26, and the electrode protection layer 25 may protect the gate electrode pattern 24 from an etchant.

Figure 3J:
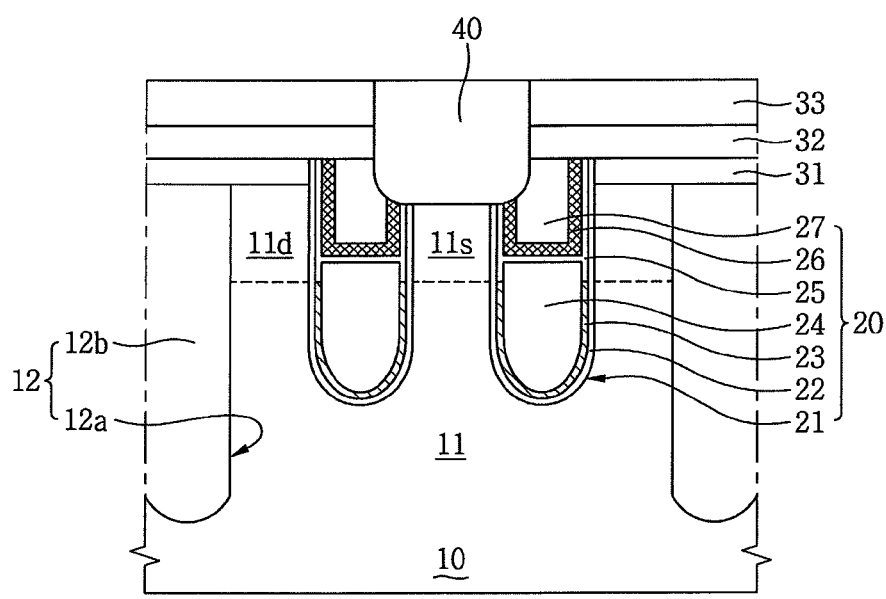

Referring to FIG. 3J, the method may include forming a bit-line contact plug 40 in the bit-line contact hole 40h. The bit-line contact plug 40 may be formed by performing an epitaxial growth process or a deposition process and further performing an etch back process. During the etch back process, the bit-line contact plug 40 may become shallower. The bit-line contact plug 40 may include a doped polysilicon, a metal, or a metal silicide. When the bit-line contact plug 40 includes a metal silicide, the bit-line contact plug 40 may be formed by a polysilicon forming process, a metal layer forming process, and a silicidation process.

Figure 3K:
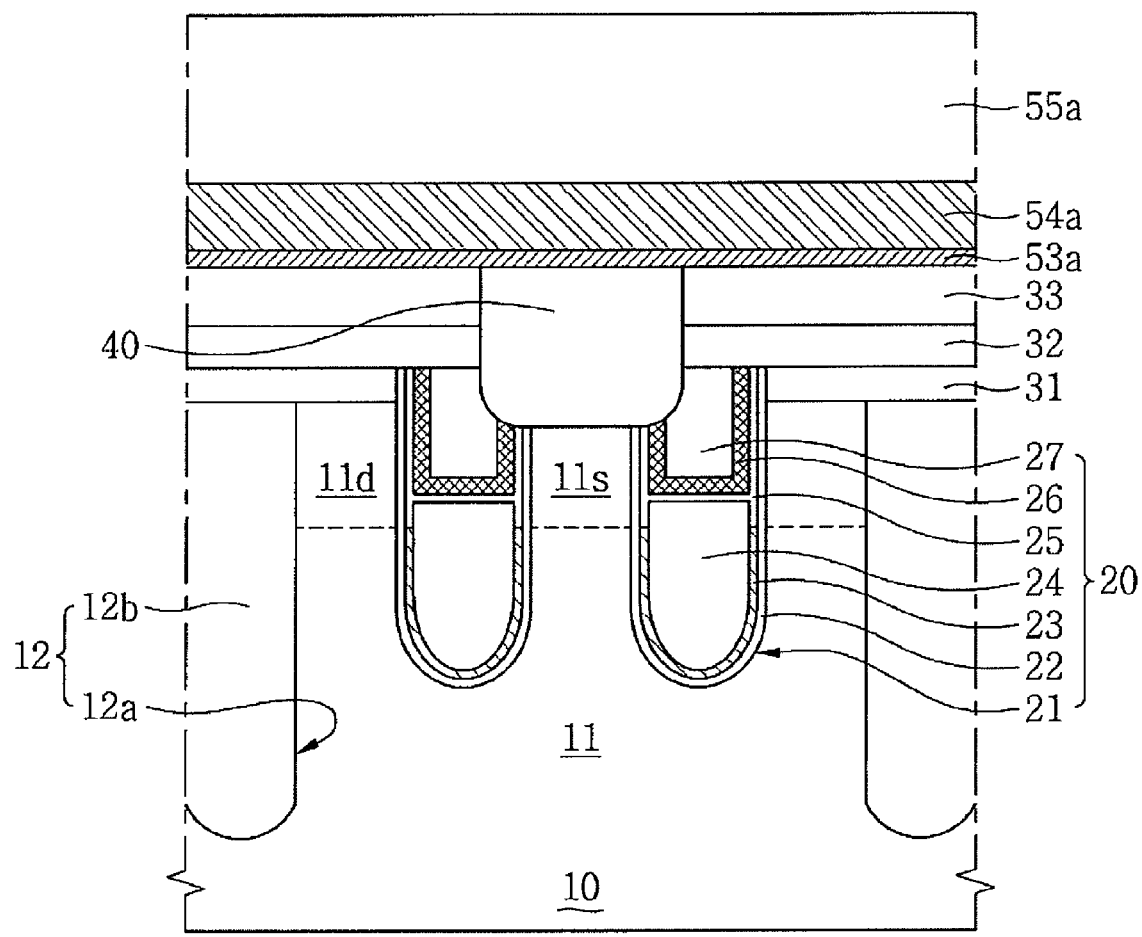

Referring to FIG. 3k, the method may include forming a bit-line barrier layer 53a, a bit-line electrode layer 54a, and a bit-line capping layer 55a by performing a deposition process on the bit-line contact plug 40. The bit-line barrier layer 53a may include a metal or a metal compound, such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN), or tungsten silicide (WSi). The bit-line electrode layer 54a may include a metal, such as tungsten or copper. The bit-line capping layer 55a may include silicon nitride.

Figure 3L:
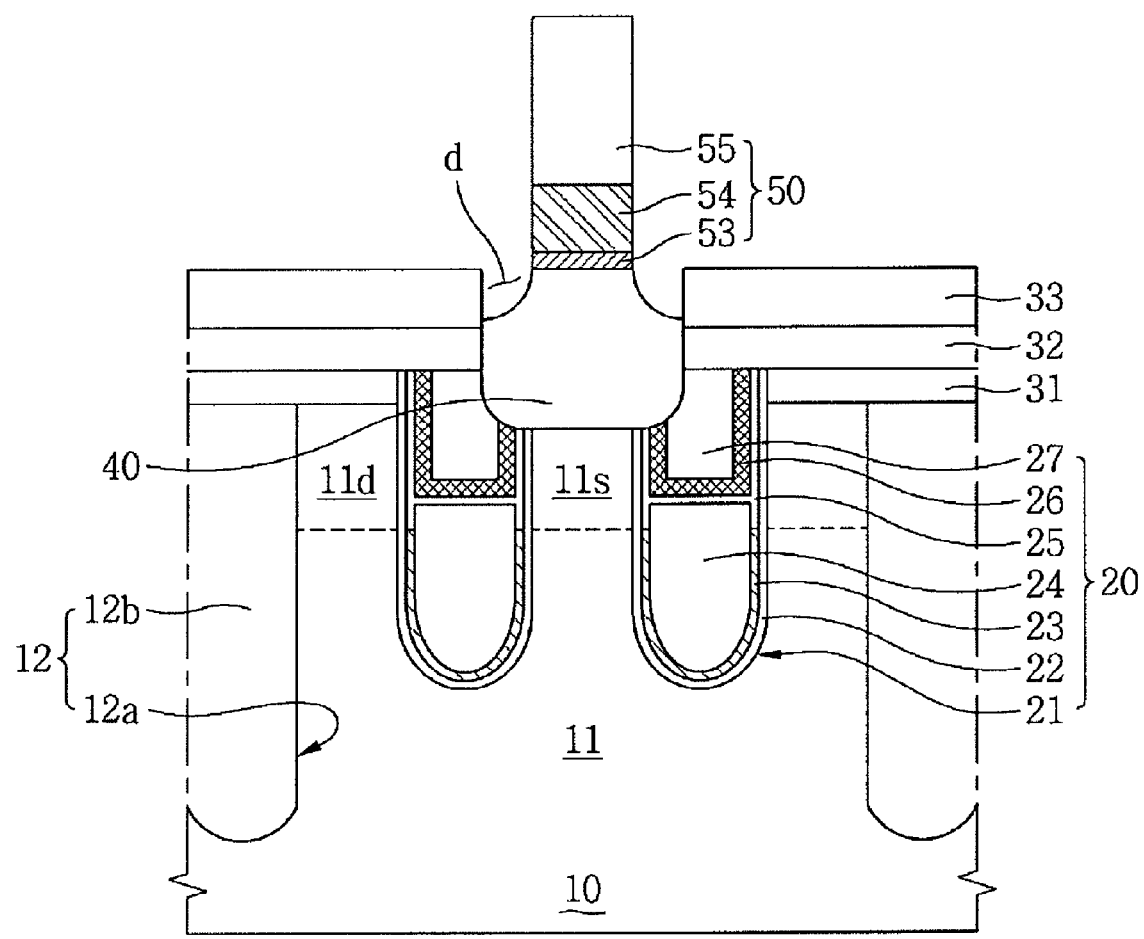

Referring to FIG. 3L, the method may include forming a bit-line structure 50 including a bit-line barrier pattern 53, a bit-line electrode pattern 54, and a bit-line capping pattern 55 by etching the bit-line capping layer 55a, the bit-line electrode layer 54a, and the bit-line barrier layer 53a. The bit-line contact plug 40 adjacent to bit-line structure 50 may have a slantly recessed dent.

Figure 3M:
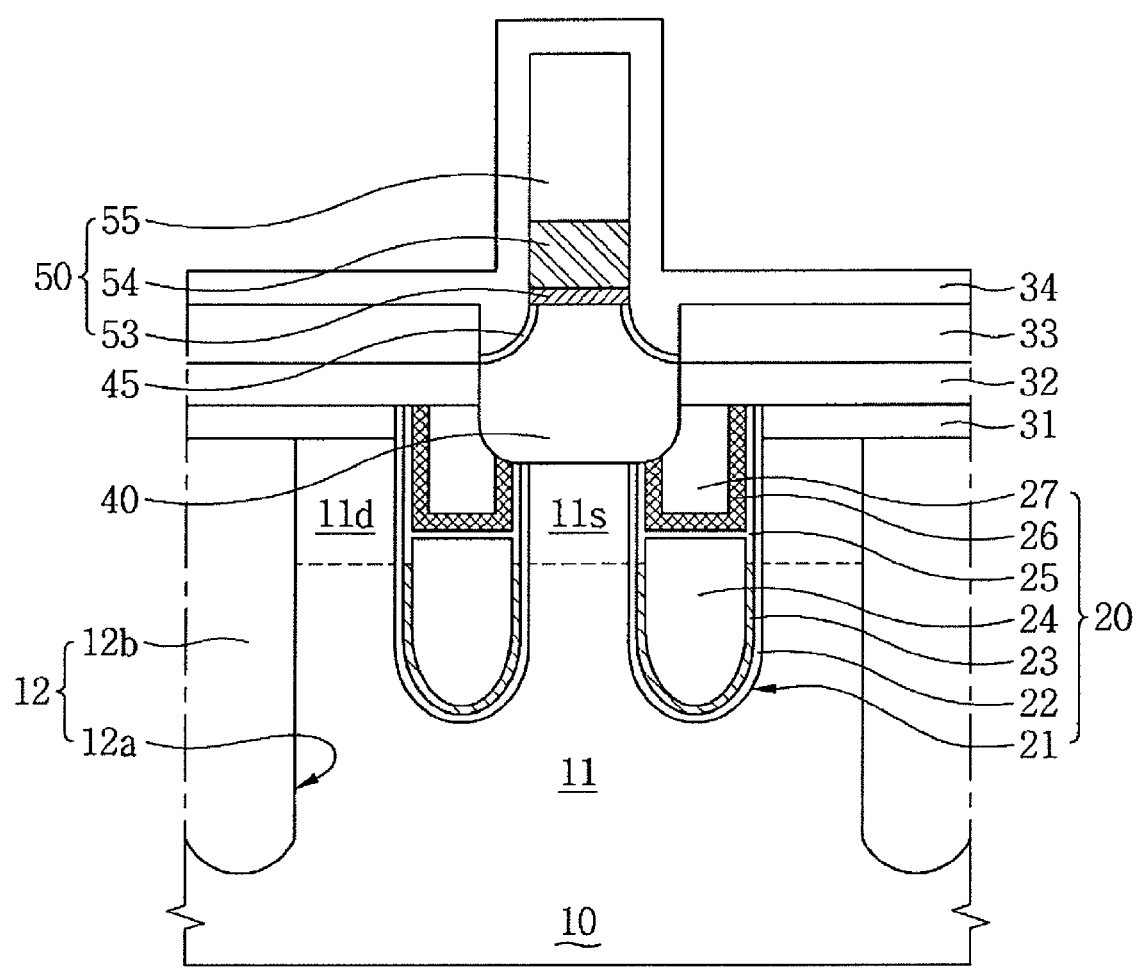

Referring to FIG. 3M, the method may include forming a protection insulating layer 45 on a slanted surface of the exposed bit-line contact plug 40, and forming a spacer layer 34 surrounding the bit-line structure 50. The protection insulating layer 45 may include silicon oxide. For example, the protection insulating layer 45 may include a native oxide. The spacer layer 34 may include silicon nitride formed by performing an ALD process or a CVD process. The spacer layer 34 may fill the dent d on the slantly recessed surface of the bit-line contact plug 40.

Figure 3N:
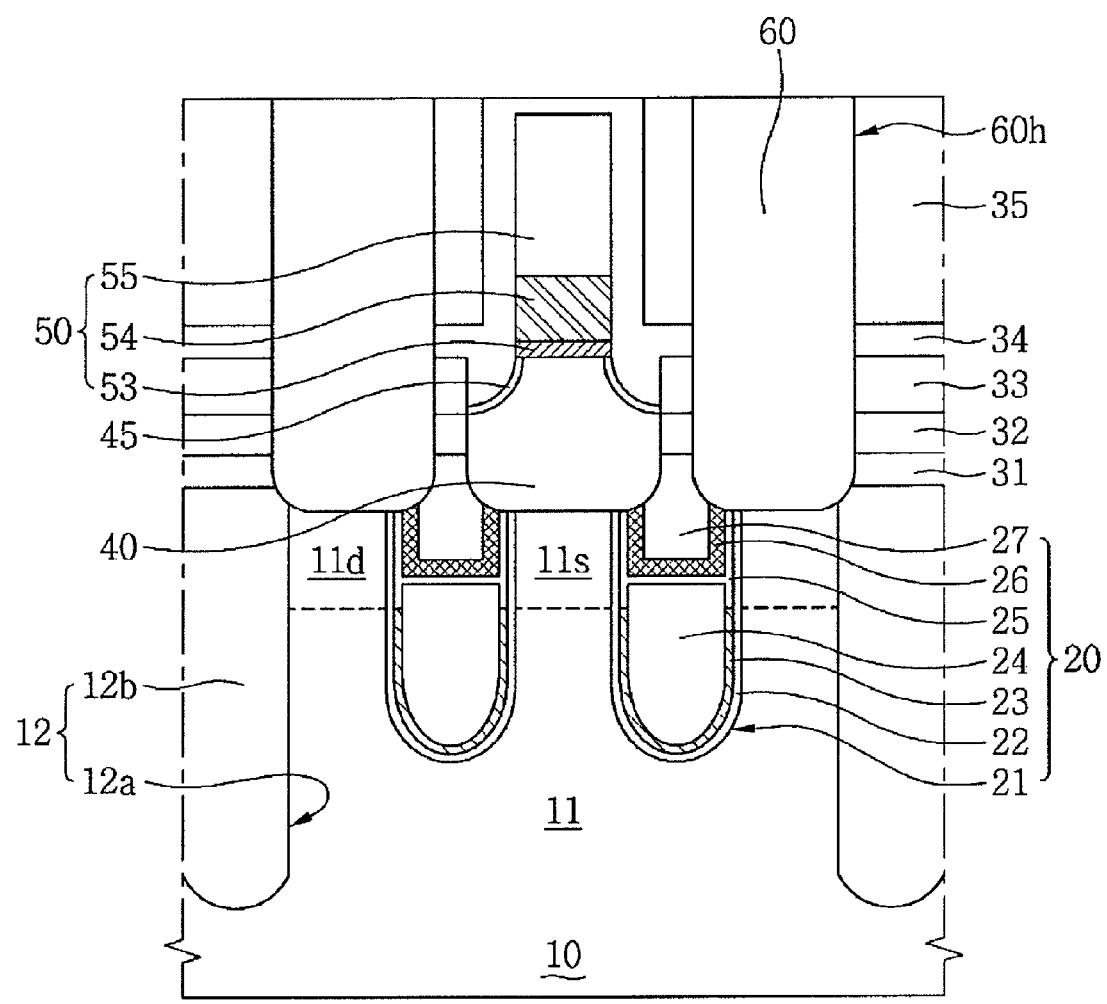
Figure 30:
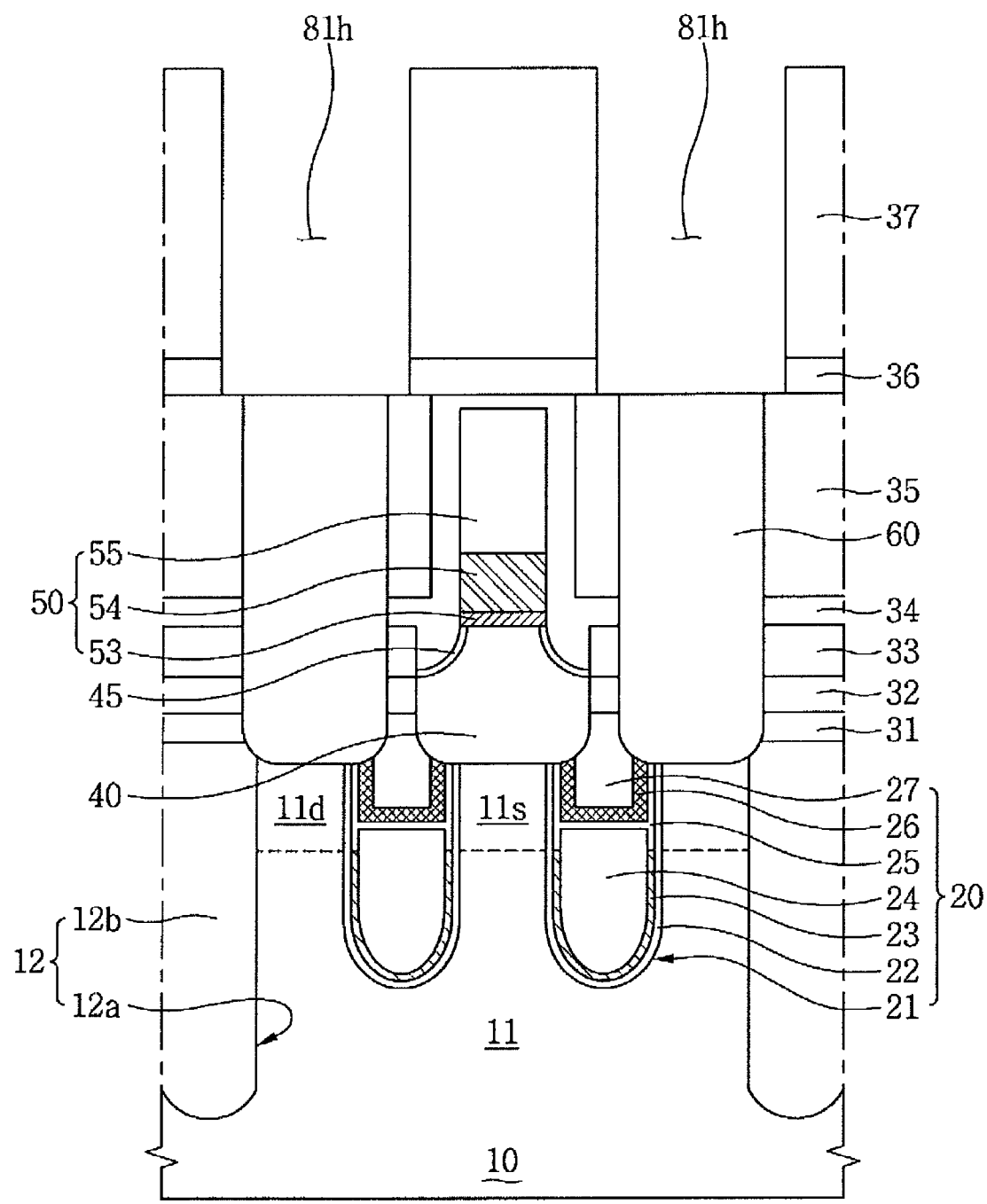

Referring to FIG. 3N, the method may include forming an upper interlayer insulating layer 35 on the spacer layer 34, forming capacitor contact holes 60h by etching the upper interlayer insulating layer 35, the spacer layer 34, the lower interlayer insulating layer 32, and the trench mask layer 31, and forming capacitor contact plugs 60 filling the capacitor contact holes 60h.

The upper interlayer insulating layer 35 may include silicon oxide formed by a deposition process. Before the capacitor contact holes 60h are formed, a CMP process for planarizing the upper interlayer insulating layer 35 may be performed.

The capacitor contact holes 60h may be vertically aligned with the drain areas 11d, respectively. Bottom surfaces of the capacitor contact holes 60h may be recessed to be lower than the surface of the substrate 10. While the etching process is performed, the gate capping insulating layer 27, the buffer oxide layer 26, and the electrode protection layer 25 may protect the gate electrode pattern 24 from being damaged by an etchant.

The method may include performing a planarization process such as a CMP process in order for upper surfaces of the capacitor contact plugs 60 to be coplanar with an upper surface of the spacer layer 34 or bit-line capping pattern 55. The capacitor contact plugs 60 may include one of a doped polysilicon, a metal, a metal silicide, and a metal compound.

Referring to FIG. 3O, the method may include forming an etch stop layer 36 on the capacitor contact plugs 60 and the spacer layer 34 or the bit-line capping pattern 55, forming a molding oxide layer 37 on the etch stop layer 36, and forming capacitor electrode holes 81h vertically passing through the molding oxide layer 37 and the etch stop layer 36 to expose the upper surface of the capacitor contact plugs 60.

The etch stop layer 36 may include silicon nitride formed by a deposition process. The molding oxide layer 37 may include silicon oxide.

Figure 3P:
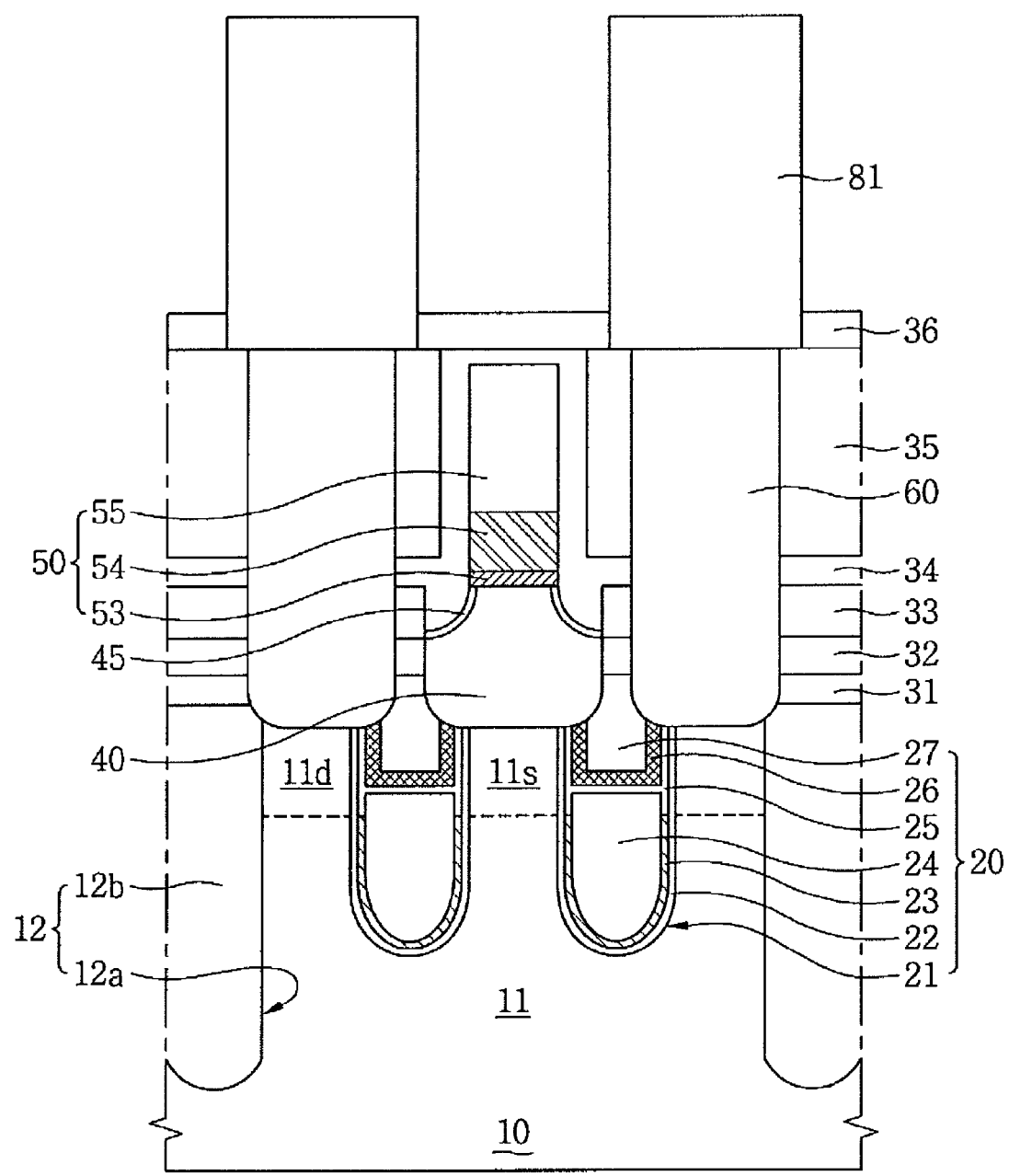

Referring to FIG. 3P, the method may include forming capacitor lower electrodes 81 filling the capacitor electrode holes 81h, and removing the molding oxide layer 37. The capacitor lower electrodes 81 may include one of a doped polysilicon, a metal, and a metal silicide which are formed by an ALD process or a CVD process.

Figure 3Q:
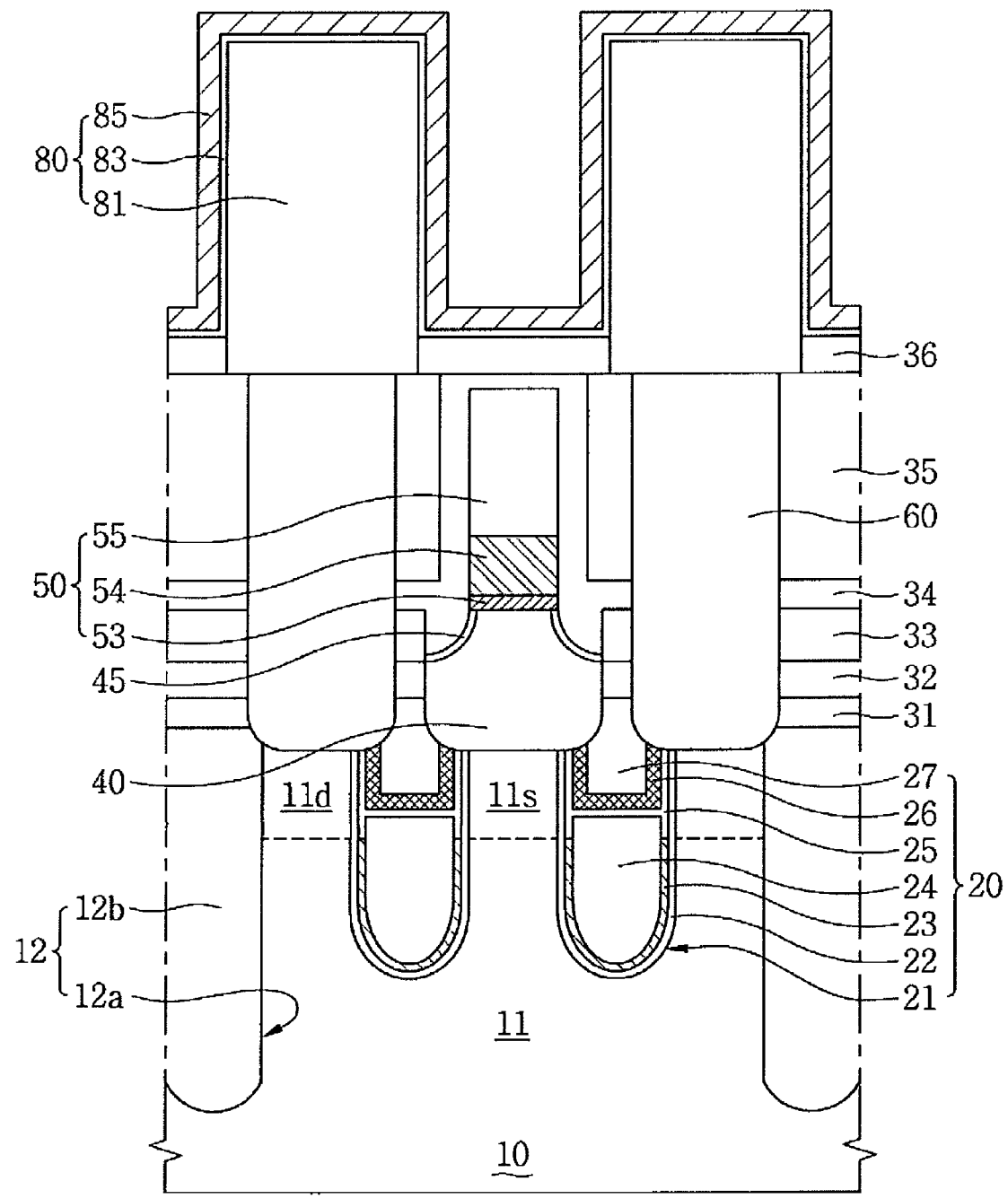

Referring to FIG. 3Q, the method may include forming a capacitor structure 80 by conformally forming a capacitor dielectric layer 83 on surfaces of the capacitor lower electrodes 81 and conformally forming a capacitor upper electrode 85 on the capacitor dielectric layer 83. The capacitor dielectric layer 83 may include a metal oxide, such as hafnium oxide, aluminum oxide, titanium oxide, tantalum oxide, ruthenium oxide, or lanthanum oxide, silicon oxide, or silicon nitride which are formed by an ALD process. The capacitor upper electrode 85 may include a metal or a metal compound formed by an ALD process.

Referring to FIG. 2A, the method may include forming a capacitor capping insulating layer 38 filling a gap between the capacitor structures 80 and covering the capacitor structures 80 on the capacitor upper electrode 85. The capacitor capping insulating layer 38 may include silicon oxide formed by, for example, a CVD process.

FIGS. 4A to 4D are vertical cross-sectional views taken along line I-I' of FIG. 1A or line of FIG. 1B for describing a method of fabricating a semiconductor device in accordance with an embodiment of the inventive concept.

Figure 4A:
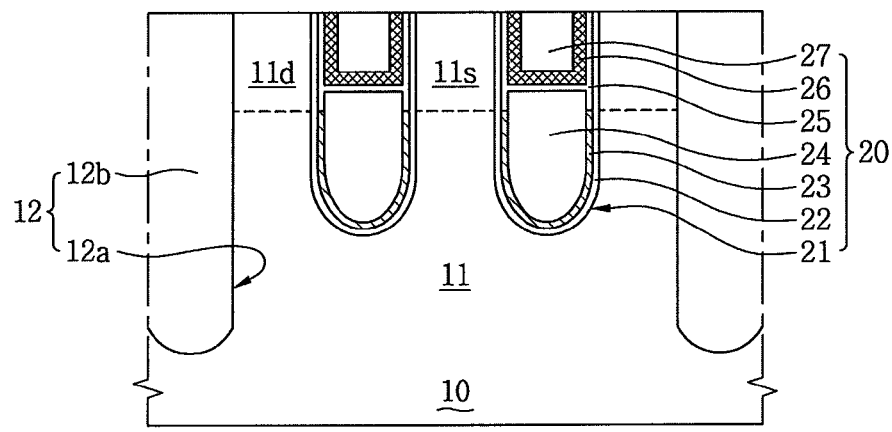

Referring to FIG. 4A, a method of fabricating a semiconductor device 100B in accordance with an embodiment of the inventive concept may include, by performing the processes described with reference to FIGS. 3A to 3G, forming device isolation regions 12 defining an active region 11 in a substrate 10, forming a trench mask layer 31 on the substrate 10, forming gate trenches 21 in the substrate 10 by performing an etching process using the trench mask layer 31 as an etch mask, conformmally forming a gate insulating layer 22 on inner walls of the gate trenches 21 and a surface of the trench mask layer 31, conformally forming a gate barrier layer 23a on the gate insulating layer 22, forming a gate electrode layer 24a filling the gate trench 21 on the gate barrier layer 23a, forming a gate electrode pattern 24 and a gate barrier pattern 23 by partially removing upper portions of the gate barrier layer 23a and the gate electrode layer 24a in the gate trench 21 by performing an etchback process, forming an electrode protection layer 25 on the gate insulating layer 22 and the gate electrode pattern 24 in the gate trench 21, forming a buffer oxide layer 26 on the electrode protection layer 25, forming a gate capping insulating layer 27 filling the gate trench 21 on the buffer oxide layer 26, forming a source area 11s and drain areas 11d, and forming a gate structure 20 including the gate insulating layer 22, the gate barrier pattern 23, the gate electrode pattern 24, the electrode protection layer 25, the buffer oxide layer 26, and the gate capping insulating layer 27 in the gate trench 21 by removing the gate capping insulating layer 27, the buffer oxide layer 26, the electrode protection layer 25, and the trench mask layer 31 which are disposed on the substrate 10 by performing a planarization process. The surface of the substrate 10 may be exposed. For example, the trench mask layer 31 may be fully removed.

Figure 4B:
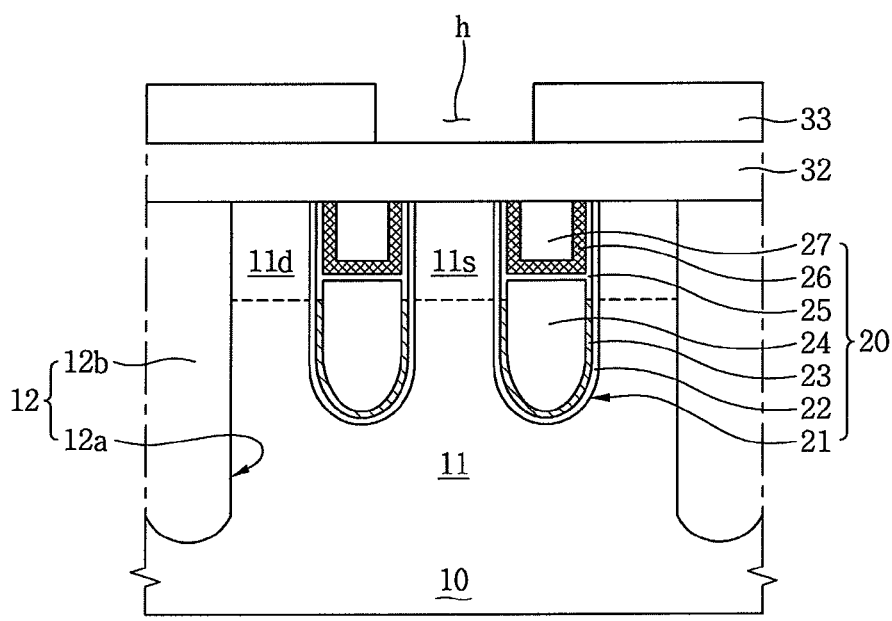

Referring to FIG. 4B, the method may include forming a lower interlayer insulating layer 32 and a hole mask layer 33 on the gate structure 20 and the exposed surface of the substrate 10, by performing the processes described with reference to FIG. 3H.

Figure 4C:
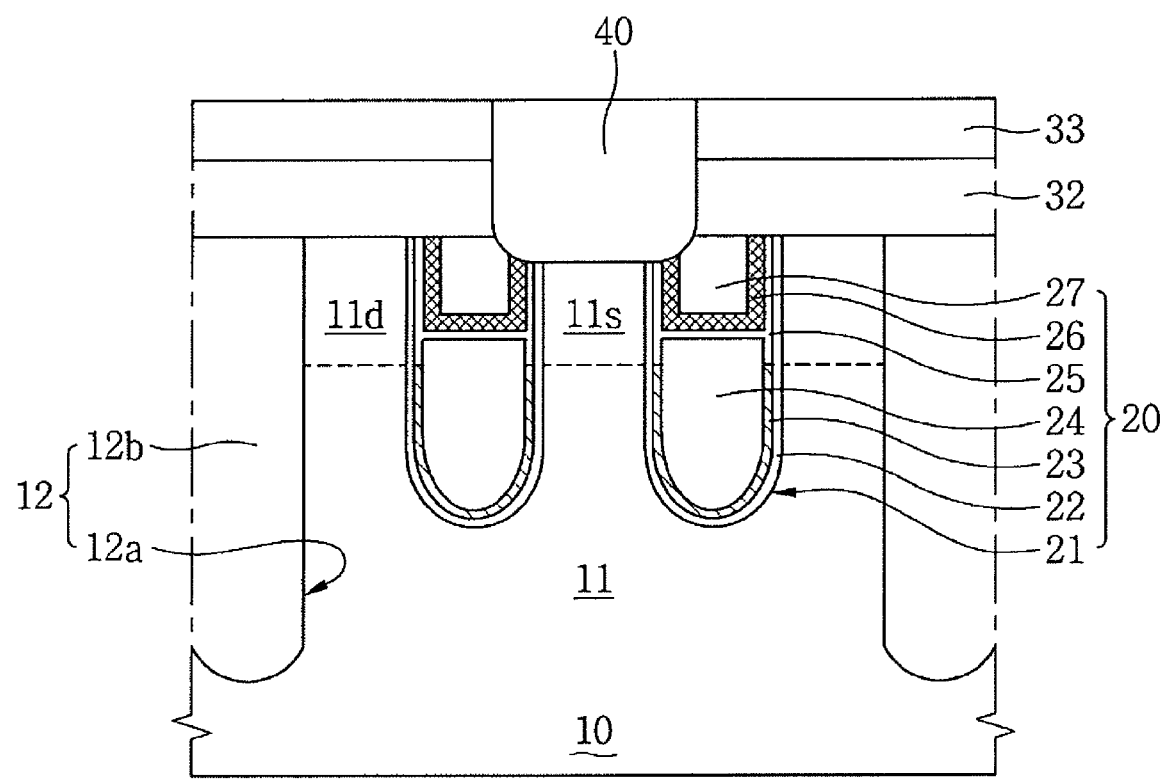

Referring to FIG. 4C, the method may include forming a bit-line contact hole 40h and forming a bit-line contact plug 40 filling the bit-line contact hole 40h, by performing the processes described with reference to FIGS. 3I and 3J.

Figure 4D:
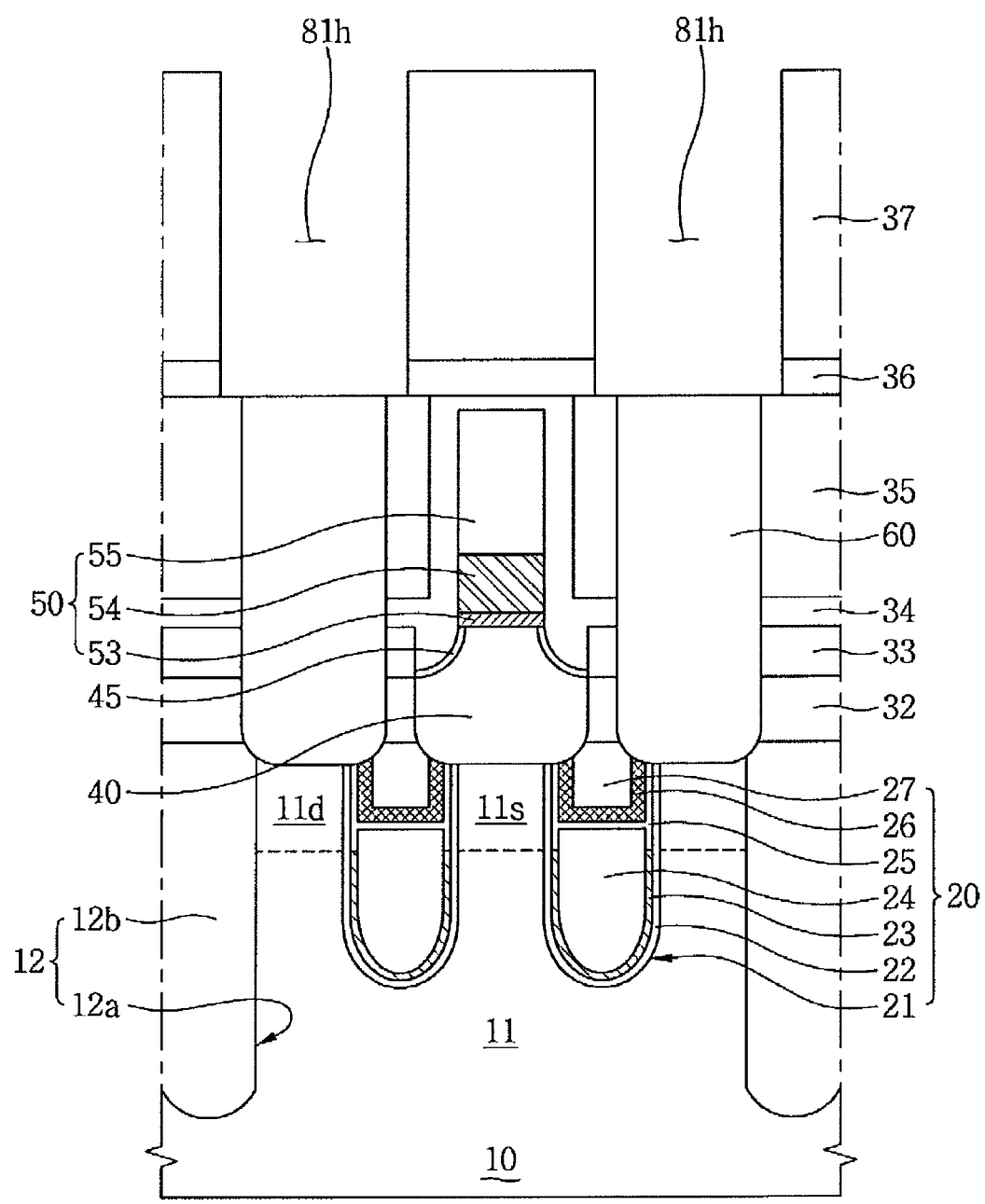

Referring to FIG. 4D, the method may include, by performing the processes described with reference to FIGS. 3K to 3O, forming a bit-line barrier layer 53a, a bit-line electrode layer 54a, and a bit-line capping layer 55a on the bit-line contact plug 40 by performing a deposition process, forming a bit-line structure 50 including a bit-line barrier pattern 53, a bit-line electrode pattern 54, and a bit-line capping pattern 55 by etching the bit-line capping layer 55a, the bit-line electrode layer 54a, and the bit-line barrier layer 53a, forming a protection insulating layer 45 on a slanted surface of the exposed bit-line contact plug 40, forming a spacer layer 34 surrounding the bit-line structure 50, forming an upper interlayer insulating layer 35 on the spacer layer 34, forming capacitor contact holes 60h, forming capacitor contact plugs 60 filling the capacitor contact holes 60h, forming an etch stop layer 36 on the capacitor contact plugs 60 and the spacer layer 34 or the bit-line capping pattern 55, forming a molding oxide layer 37 on the etch stop layer 36, and forming capacitor electrode holes 81h vertically passing through the molding oxide layer 37 and the etch stop layer 36 to expose the upper surfaces of the capacitor contact plugs 60.

In an exemplary embodiment, the method may include, with reference to FIGS. 3O, 3P, and 2B, forming capacitor structures 80 including capacitor lower electrodes 81, a capacitor dielectric layer 83, and capacitor upper electrodes 85, and a capacitor capping insulating layer 38.

Figure 5A:
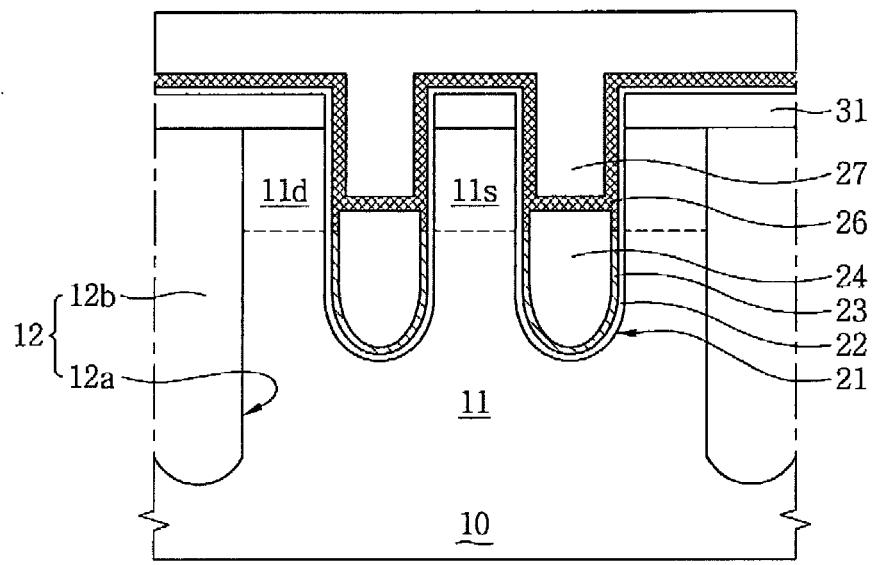
Figure 5B:
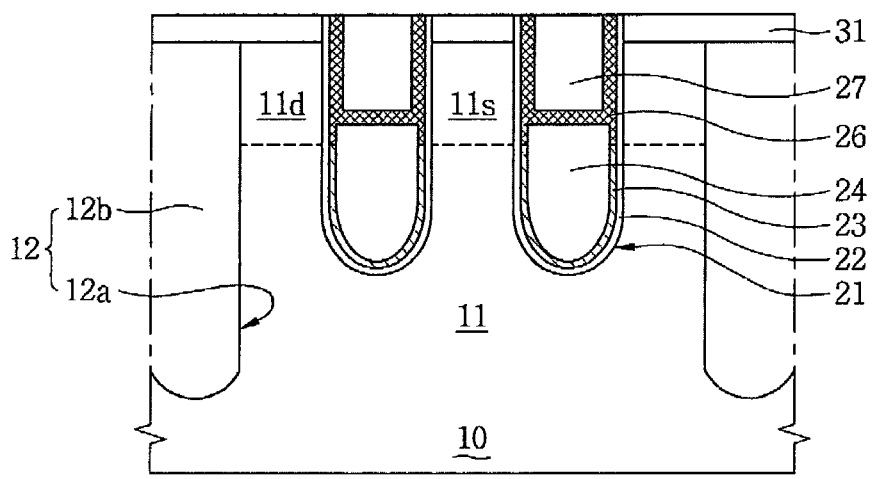
Figure 5C:
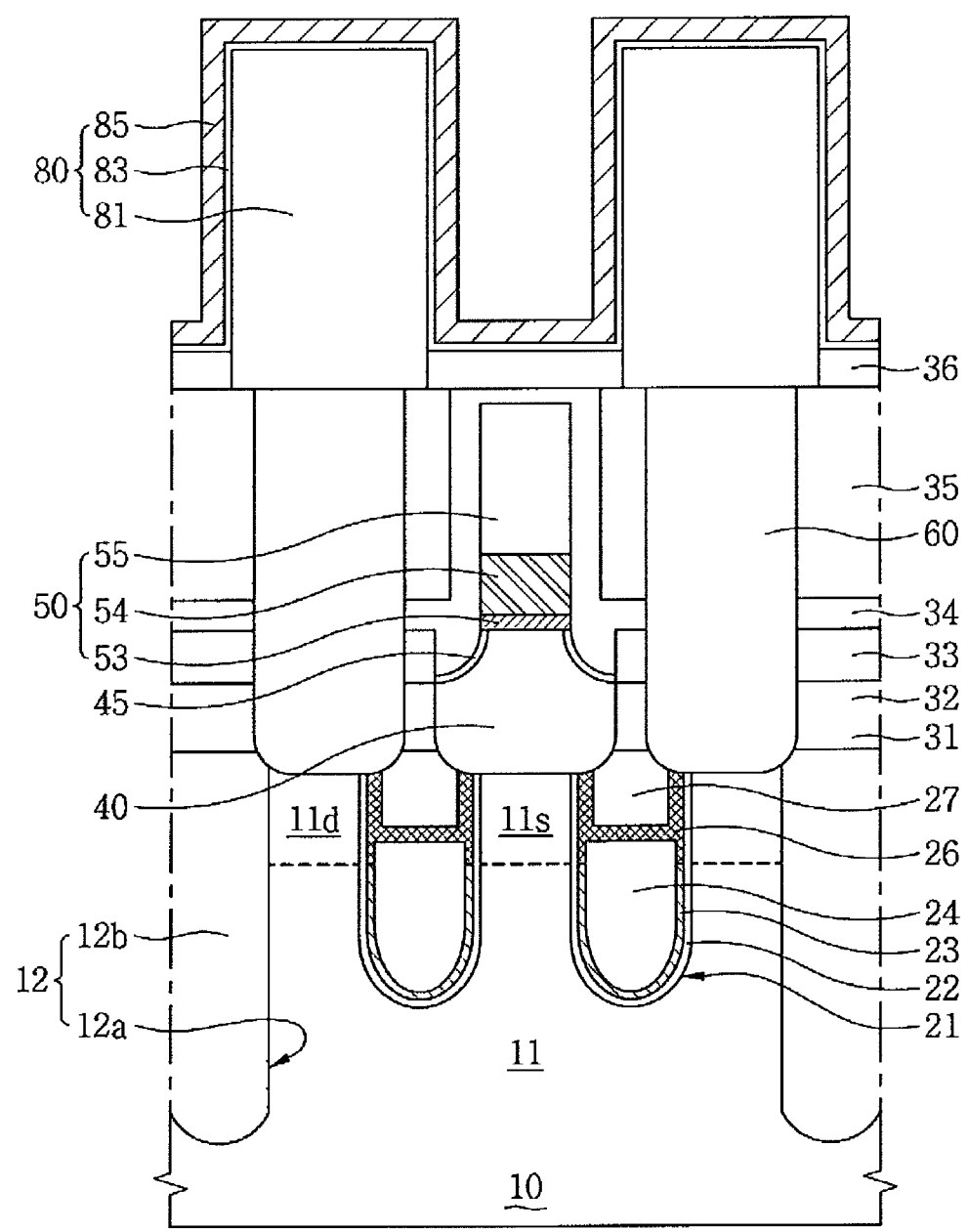

FIGS. 5A to 5C are vertical cross-sectional views taken along line I-I' of FIG. 1A or line II-II' of FIG. 1B for describing a method of fabricating a semiconductor device in accordance with an embodiment of the inventive concept.

Referring to FIG. 5A, a method of fabricating a semiconductor device 100C in accordance with an embodiment of the inventive concept may include, with reference to FIGS. 3A to 3E, forming device isolation regions 12 defining an active region 11 in a substrate 10, forming a trench mask layer 31 on the substrate 10, forming gate trenches 21 in the substrate 10 by performing an etching process using the trench mask layer 31 as an etch mask, conformally forming a gate insulating layer 22 on inner walls of the gate trenches 21 and a surface of the trench mask layer 31, conformally forming a gate barrier layer 23a on the gate insulating layer 22, forming a gate electrode layer 24a filling the gate trench 21 on the gate barrier layer 23a, forming a gate electrode pattern 24 and a gate barrier pattern 23 by partially removing upper portions of the gate barrier layer 23a and the gate electrode layer 24a in the gate trench 21 by performing an etchback process, forming a buffer oxide layer 26 directly on the gate insulating layer 22 and the gate electrode pattern 24 in the gate trench 21, forming a gate capping insulating layer 27 filling the gate trench 21 on the buffer oxide layer 26, and forming a source area 11s and drain areas 11d.

Referring to FIG. 5B, the method may include forming a gate structure 20 including the gate insulating layer 22, the gate barrier pattern 23, the gate electrode pattern 24, the electrode protection layer 25, and the buffer oxide layer 26 in the gate trench 21 by removing the gate capping insulating layer 27 and the buffer oxide layer 26 which are disposed on the trench mask layer 31 by performing a planarization process. The planarization process may include a CMP process. An upper surface of the trench mask layer 31 may be exposed.

Referring to FIG. 5C, the method may include, by performing the processes described with reference to FIGS. 3H to 3Q, forming a lower interlayer insulating layer 32 and a hole mask layer 33, forming a bit-line contact plug 40, forming a bit-line structure 50 including a bit-line barrier pattern 53, a bit-line electrode pattern 54, and a bit-line capping pattern 55, forming a spacer layer 34, forming an upper interlayer insulating layer 35, forming capacitor contact plugs 60, forming an etch stop layer 36, and forming a capacitor structure 80 including a capacitor lower electrode 81, a capacitor dielectric layer 83, and a capacitor upper electrode 85.

The method may include forming a capacitor capping insulating layer 38 with reference to FIG. 2C.

Figure 6A:
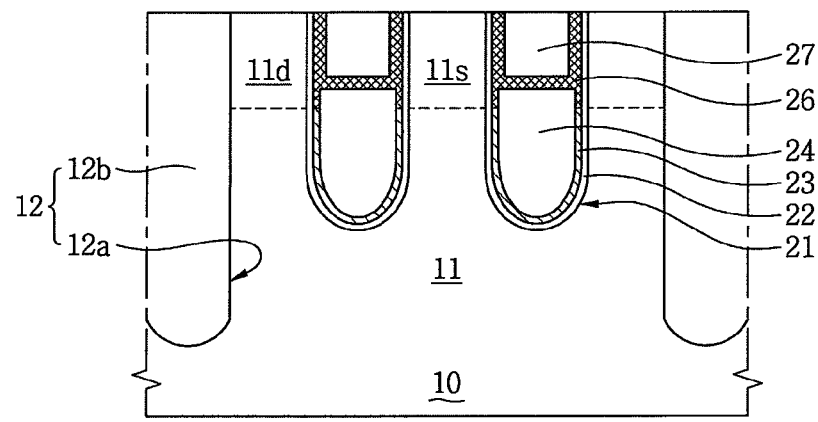
Figure 6B:
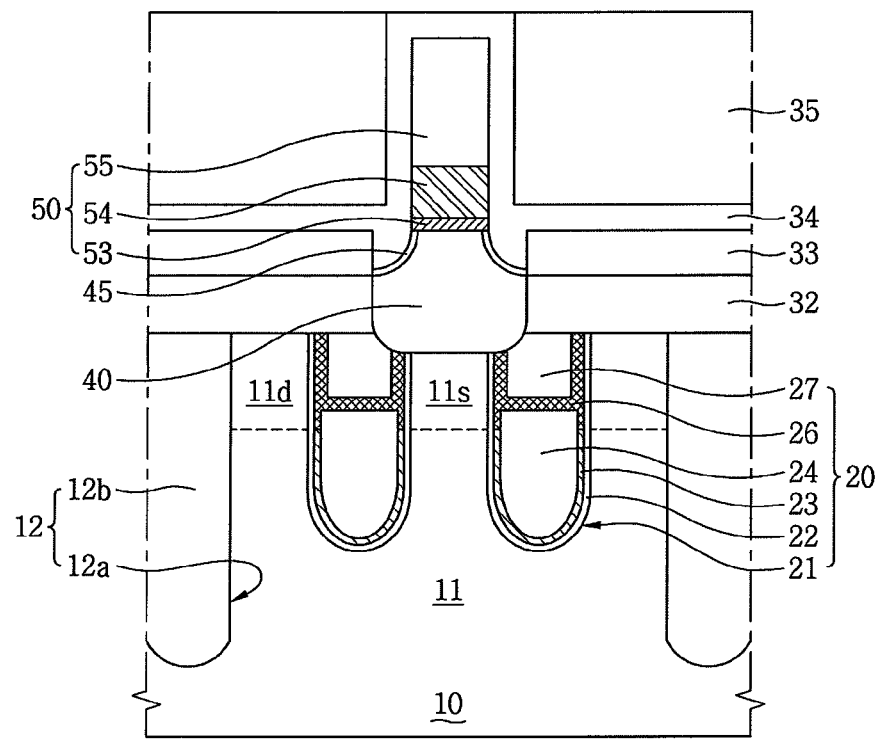

FIGS. 6A and 6B are vertical cross-sectional views taken along line I-I' of FIG. 1A or line II-II' of FIG. 1B for describing a method of fabricating a semiconductor device in accordance with an embodiment of the inventive concept.

Referring to FIG. 6A, a method of fabricating a semiconductor device 100D in accordance with an embodiment of the inventive concept may include, by performing the processes described with reference to FIGS. 3A to 3E and FIG. 5A, forming device isolation regions 12 defining an active region 11 in a substrate 10, forming a trench mask layer 31 on the substrate 10, forming gate trenches 21 in the substrate 10 by performing an etching process using the trench mask layer 31 as an etch mask, conformally forming a gate insulating layer 22 on inner walls of the gate trenches 21 and a surface of the trench mask layer 31, conformally forming a gate barrier layer 23a on the gate insulating layer 22, forming a gate electrode layer 24a filling the gate trench 21 on the gate barrier layer 23a, forming a gate electrode pattern 24 and a gate barrier pattern 23 by partially removing upper portions of the gate barrier layer 23a and the gate electrode layer 24a in the gate trench 21 by performing an etchback process, forming a buffer oxide layer 26 directly on the gate insulating layer 22 and the gate electrode pattern 24 in the gate trench 21, forming a gate capping insulating layer 27 filling the gate trench 21 on the buffer oxide layer 26, forming a source area 11s and drain areas 11d, forming a gate structure 20 including the gate insulating layer 22, the gate barrier pattern 23, the gate electrode pattern 24, the buffer oxide layer 26, and the gate capping insulating layer 27 in the gate trench 21 by removing the gate capping insulating layer 27, the buffer oxide layer 26, the electrode protection layer 25, and the trench mask layer 31 which are disposed on the substrate 10 by performing a planarization process. A surface of the substrate 10 may be exposed. For example, the trench mask layer 31 may be fully removed.

Referring to FIG. 6B, the method may include, by performing the processes described with reference to FIGS. 3H to 3M, forming a lower interlayer insulating layer 32 and a hole mask layer 33, forming a bit-line contact plug 40, forming a bit-line structure 50 including a bit-line barrier pattern 53, a bit-line electrode pattern 54, and a bit-line capping pattern 55, forming a spacer layer 34, and forming an upper interlayer insulating layer 35.

In an embodiment, the method may include, by performing the processes described with reference to FIGS. 3N to 3Q and FIG. 2D, forming capacitor contact plugs 60, forming capacitor structures 80 including capacitor lower electrodes 81, a capacitor dielectric layer 83, and capacitor upper electrodes 85, and forming a capacitor capping insulating layer 38 covering the capacitor structures 80.

FIGS. 7A to 7D are vertical cross-sectional views taken along line I-I' of FIG. 1A or line II-II' of FIG. 1B for describing a method of fabricating a semiconductor device in accordance with an embodiment of the inventive concept.

Figure 7A:
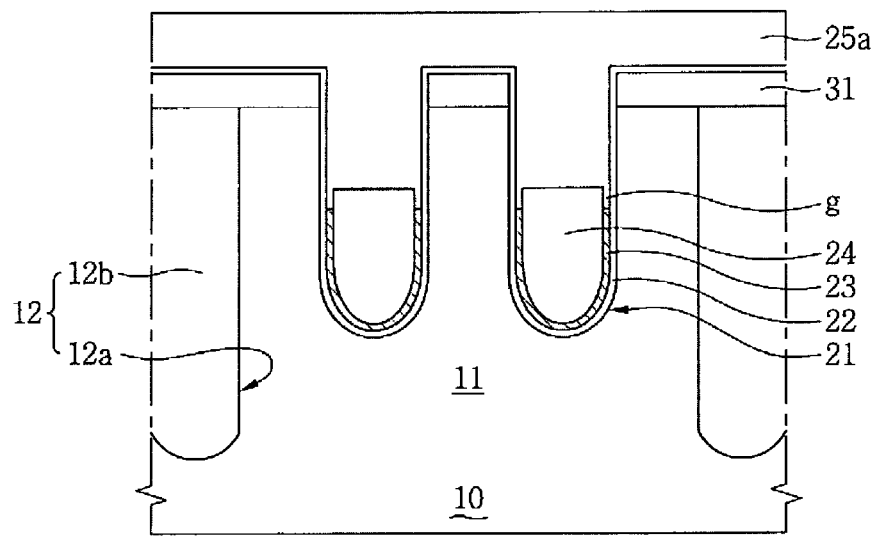

Referring to FIG. 7A, a method of fabricating a semiconductor device 100E in accordance with an embodiment of the inventive concept may include, by performing the processes described with reference to FIGS. 3A to 3E, forming device isolation regions 12 defining an active region 11 in a substrate 10, forming gate trenches 21, conformally forming a gate insulating layer 22 on an inner wall of the gate trench 21, conformally forming a gate barrier layer 23a on the gate insulating layer 22, forming a gate electrode layer 24a filling the gate trench 21, forming a gate electrode pattern 24 and a gate barrier pattern 23 by partially removing upper portions of the gate barrier layer 23a and the gate electrode layer 24a, and forming an electrode protection material layer 25a filling the gate trench 21.

An upper end of the gate barrier pattern 23 may be recessed to be lower than an upper surface of the gate electrode pattern 24. The electrode protection material layer 25a may fill a gap between the gate insulating layer 22 and the gate electrode pattern 24 on the upper end of the recessed the gate barrier pattern 23. The electrode protection material layer 25a may include silicon nitride.

Figure 7B:
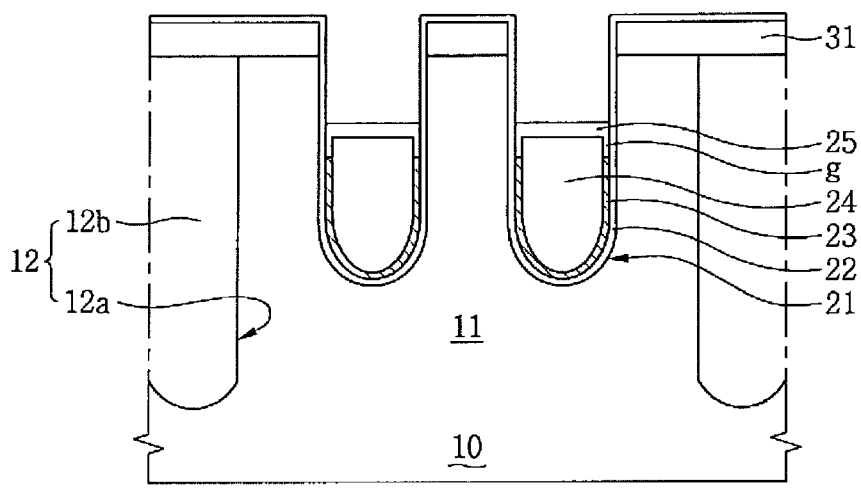

Referring to FIG. 7B, the method may include forming an electrode protection layer 25 existing in a portion of the gate trench 21 and covering the gate barrier pattern 23 and the gate electrode pattern 24, by removing an upper portion of the electrode protection material layer 25a by performing an etchback process.

Figure 7C:
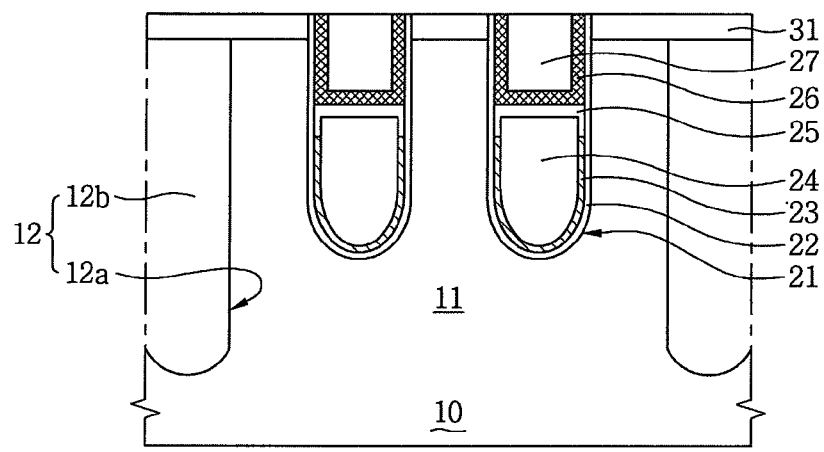

Referring to FIG. 7C, the method may include forming a gate structure 20 including the gate insulating layer 22, the gate barrier pattern 23, the gate electrode pattern 24, the electrode protection layer 25, the buffer oxide layer 26, and the gate capping insulating layer 27 by performing the processes described with reference to FIGS. 3F and 3G.

The buffer oxide layer 26 may include N-type impurities such as phosphorus (P). Accordingly, the N-type impurities of the buffer oxide layer 26 may diffuse into the active region 11 to form a source area 11s and drain areas 11d in this process.

Figure 7D:
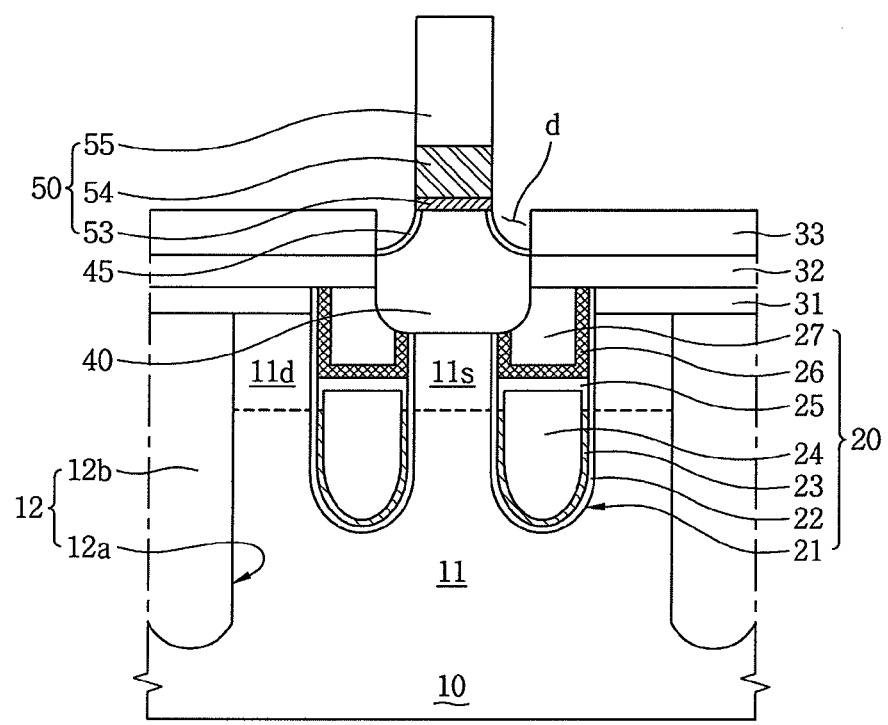

Referring to FIG. 7D, the method may include, by performing the processes described with reference to FIGS. 3H to 3M, forming a lower interlayer insulating layer 32, forming a bit-line contact plug 40, forming a bit-line structure 50 including a bit-line barrier pattern 53, a bit-line electrode pattern 54, and a bit-line capping pattern 55, and forming a protection insulating layer 45 on a slantly exposed surface of the bit-line contact plug 40. The protection insulating layer 45 may include a native oxide. When the bit-line contact plug 40 is not polysilicon, a process of forming the protection insulating layer 45 may be omitted.

In an embodiment, the method may include, by performing the processes described with reference to FIGS. 3M to 3Q and FIG. 2E, forming a spacer layer 34, forming an upper interlayer insulating layer 35, forming a trench mask layer 31, forming capacitor contact plugs 60, forming an etch stop layer 36, forming a capacitor structure 80 including a capacitor lower electrode 81, a capacitor dielectric layer 83, and a capacitor upper electrode 85, and forming a capacitor capping insulating layer 38.

Figure 8:
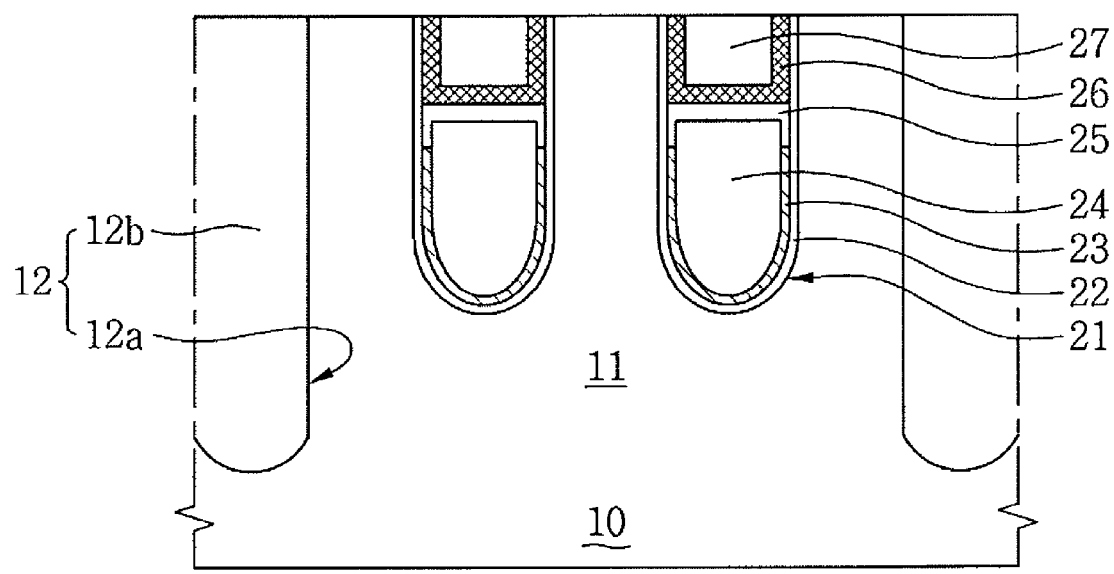

FIG. 8 is a vertical cross-sectional view taken along line I-I' of FIG. 1A or line II-II' of FIG. 1B for describing a method of fabricating a semiconductor device in accordance with an embodiment of the inventive concept.

Referring to FIG. 8, a method of fabricating a semiconductor device 100F in accordance with an embodiment of the inventive concept may include, by performing the processes described with reference to FIGS. 3A to 3G and FIGS. 7A to 7C, forming device isolation regions 12 defining an active region 11 in a substrate 10, forming gate trenches 21, conformally forming a gate insulating layer 22 on an inner wall of the gate trench 21, conformally forming a gate barrier layer 23a on the gate insulating layer 22, forming a gate electrode layer 24a filling the gate trench 21, forming a gate electrode pattern 24 and a gate barrier pattern 23 by partially removing upper portions of the gate barrier layer 23a and the gate electrode layer 24a, forming an electrode protection material layer 25a filling the gate trench 21, forming an electrode protection layer 25 existing in a portion of the gate trench 21 and covering the gate barrier pattern 23 and the gate electrode pattern 24 by removing an upper portion of the electrode protection material layer 25a, forming a gate structure 20 including the gate insulating layer 22, the gate barrier pattern 23, the gate electrode pattern 24, the electrode protection layer 25, the buffer oxide layer 26, and the gate capping insulating layer 27, and forming a lower interlayer insulating layer 32 directly on the substrate 10 and the gate structure 20.

In an embodiment, the method may include, by performing the processes described with reference to FIGS. 3H to 3Q and FIG. 2F, forming a hole mask layer 33, forming a bit-line contact plug 40, forming a bit-line structure 50, forming a spacer layer 34, forming an upper interlayer insulating layer 35, forming a trench mask layer 31, forming capacitor contact plugs 60, forming an etch stop layer 36, forming a capacitor structure 80 including a capacitor lower electrode 81, a capacitor dielectric layer 83, and a capacitor upper electrode 85, and forming a capacitor capping insulating layer 38.

Figure 9:
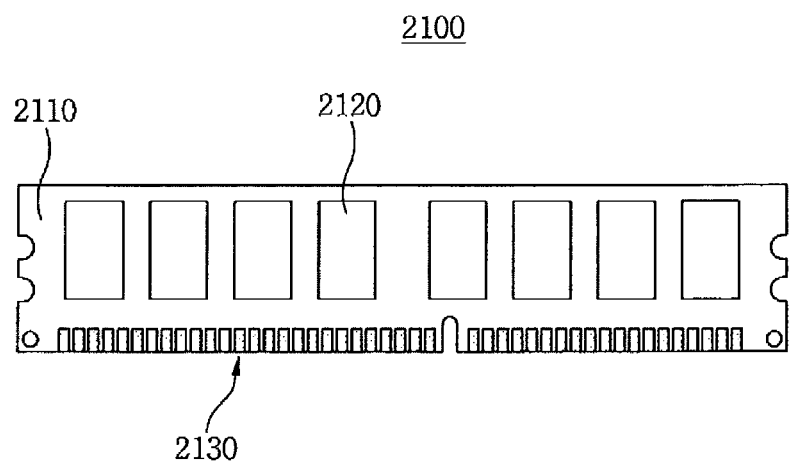
FIG. 9 is a diagram conceptually showing a memory module including at least one of the semiconductor devices in accordance with various embodiments of the inventive concept.

FIG. 9 is a diagram conceptually showing a memory module 2100 including at least one of the semiconductor devices 100A to 100F in accordance with various embodiments of the inventive concept. Referring to FIG. 9, the memory module 2100 in accordance with the embodiment of the inventive concept may include a module substrate 2110, a plurality of memory devices 2120 disposed on the module substrate 2110, and a plurality of terminals 2130 arranged on a side of the module substrate 2110. The module substrate 2110 may include a printed circuit board (PCB). The memory devices 2120 may include one of the semiconductor devices 100A to 100F in accordance with various embodiments of the inventive concept. The plurality of terminals 2130 may include a metal such as copper. Each of the terminals 2130 may be electrically connected to each of the memory devices 2120. When the memory module 2100 includes memory devices 2120 having a low leakage current and superior carrier mobility, device performance may be improved.

Figure 10:
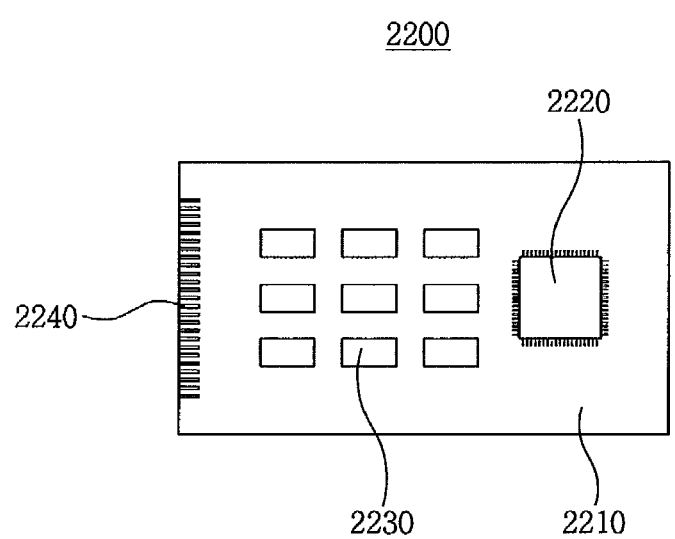
FIG. 10 is a diagram conceptually showing a semiconductor module in accordance with an embodiment of the inventive concept.

FIG. 10 is a diagram conceptually showing a semiconductor module 2200 in accordance with an embodiment of the inventive concept. Referring to FIG. 10, the semiconductor module 2200 in accordance with the embodiment of the inventive concept may include a processor 2220 mounted on a module substrate 2210, and semiconductor devices 2230. The processor 2220 or the semiconductor devices 2230 may include at least one of the semiconductor devices 100A to 100F in accordance with various embodiments of the inventive concept. Conductive input/output terminals 2240 may be disposed on at least one side of the module substrate 2210.

Figure 11:
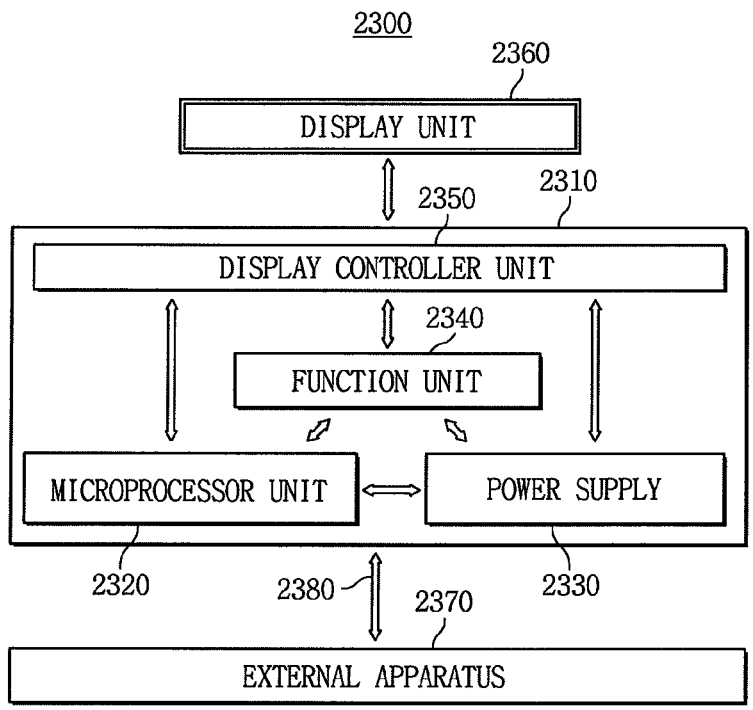
FIGS. 11 and 12 are block diagrams conceptually showing electronic systems in accordance with embodiments of the inventive concept.

FIG. 11 is a block diagram conceptually showing an electronic system 2300 in accordance with an embodiment of the inventive concept. Referring to FIG. 11, the electronic system 2300 in accordance with the embodiment of the inventive concept may include a body 2310, a display unit 2360, and an external apparatus 2370. The body 2310 may include a microprocessor unit 2320, a power supply 2330, a function unit 2340, and/or a display controller unit 2350. The body 2310 may be a system board or mother board including a PCB and/or a case. The microprocessor unit 2320, the power supply 2330, the function unit 2340, and the display controller unit 2350 may be mounted or arranged on a top surface or an inside of the body 2310. The display unit 2360 may be disposed the top surface of the body 2310 or an inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-pad, a touch-screen, a volatile/nonvolatile memory, a memory card controller, a camera, a light, an audio and video playback processor, a wireless transmission/reception antenna, a speaker, a microphone, a USB port, and other units having various functions. The microprocessor unit 2320 or the function unit 2340 may include at least one of the semiconductor devices 100A to 100F in accordance with various embodiments of the inventive concept.

Figure 12:
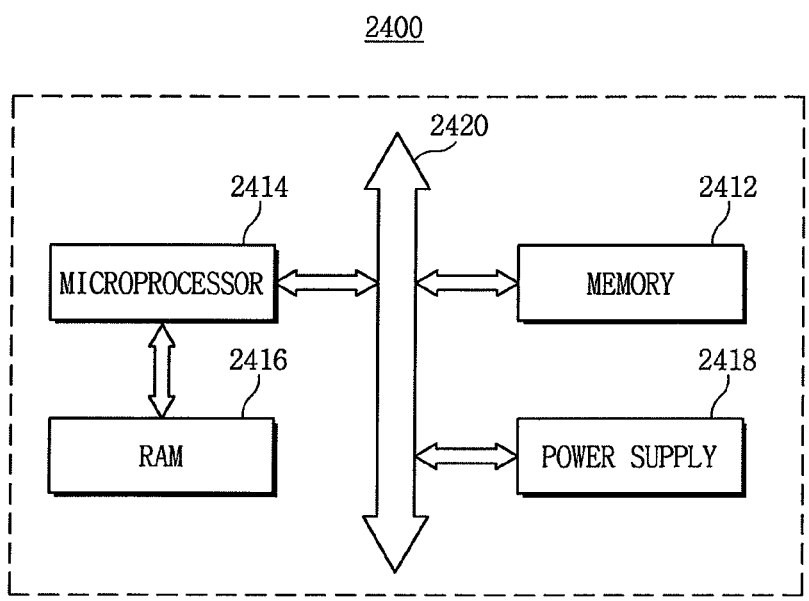

Referring to FIG. 12, an electronic system 2400 in accordance with an embodiment of the inventive concept may include a microprocessor 2414, a memory 2412, and a user interface 2418 which performs data communication using a bus 2420. The microprocessor 2414 may include a CPU or an AP. The electronic system 2400 may include a random access memory (RAM) 2416, which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a light, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 100A to 100F in accordance with various embodiments of the inventive concept.

Semiconductor devices in accordance with various embodiments of the inventive concept may include a gate structure in which an upper end of a gate barrier pattern is recessed to be lower than an upper end of a gate electrode pattern. When the upper end of the gate barrier pattern is recessed, a distance between the gate electrode pattern and a source area and a distance between the gate electrode pattern and drain areas may be increased. Accordingly, a GIDL current caused by turn-on of the gate structure may be decreased.

Semiconductor devices in accordance with various embodiments of the inventive concept may include a gate structure having a silicon oxide layer. The silicon oxide layer may reduce a compressive stress that a silicon nitride layer of the gate structure applies on an active region (channel) of a substrate. Accordingly, reduction of carrier (electron) mobility can be reduced.

When the silicon oxide layer is softer and more flexible than the silicon nitride layer, negative phenomena occurring due to a difference in thermal expansion coefficients between silicon and silicon nitride can be prevented or reduced.

The silicon oxide layer may include N-type impurities such as phosphorus (P). The N-type impurities of the silicon oxide layer may diffuse and move into the active region of the substrate through a diffusion process. Accordingly, a source area and drain areas with no physical damage may be formed in the active region.

The foregoing is illustrative of embodiments and is not to be construed as limiting thereof. Although a few embodiments have been described, those skilled in the art will readily appreciate that many modifications are possible without materially departing from the present inventive concept. Accordingly, all such modifications are intended to be included within the scope of this inventive concept as defined in the claims.

What is claimed is:

1. A semiconductor device, comprising:
a device isolation region defining an active region in a substrate; and
gate structures buried in the active region of the substrate, wherein at least one of the gate structures comprises:
a gate trench;
a gate barrier pattern disposed on a lower portion of the gate trench;
a gate electrode pattern formed on the gate barrier pattern and filling the lower portion of the gate trench;
a buffer oxide layer formed on the gate electrode pattern;
a gate capping insulating layer formed on the buffer oxide layer to fill the upper portion of the gate trench,
wherein the gate barrier pattern has a top surface which is lower than a top of the gate electrode pattern; and
an electrode protection layer disposed on the gate electrode pattern, wherein the electrode protection layer comprises a protruding portion in direct contact with the top surface of the gate barrier pattern below the top of the gate electrode pattern.

2. The semiconductor device of claim 1, further comprising a gate insulating layer formed on the entire inner wall of the gate trench.

3. The semiconductor device of claim 2, wherein the gate insulating layer covers outside wall of the gate barrier pattern and side wall of the buffer oxide layer.

4. The semiconductor device of claim 1,
wherein at least portion of the electrode protection layer is interposed between the buffer oxide layer and the gate electrode pattern.

5. The semiconductor device of claim 4, wherein a portion of the electrode protection layer is interposed between the gate insulating layer and the gate electrode pattern.

6. The semiconductor device of claim 4, wherein the electrode protection layer includes silicon nitride.

7. The semiconductor device of claim 1, wherein the buffer oxide layer includes silicon oxide containing N-type impurities.

8. The semiconductor device of claim 7, further comprising a source area disposed between the gate structures,
wherein the source area includes the same dopant as the N-type impurities included in the buffer oxide layer.

9. The semiconductor device of claim 8, further comprising a bit-line contact plug vertically aligned with and overlapping the source area,
wherein a side of a bottom surface and a bottom of a side surface of the bit-line contact plug contacts the gate capping insulating layer or the buffer oxide layer.

10. The semiconductor device of claim 1, wherein a bottom and side surfaces of the gate capping insulating layer are covered by the buffer oxide layer.

11. The semiconductor device of claim 1, wherein the gate capping insulating layer includes silicon nitride.

12. The semiconductor device of claim 1, wherein the buffer oxide layer is U-shaped.

13. A semiconductor device, comprising:
gate structures buried in a substrate;
a bit-line contact plug formed on the substrate to be vertically aligned with the substrate between the gate structures;
a bit-line structure formed on the bit-line contact plug; and
a spacer layer covering the bit-line structure,
wherein each of the gate structures includes:
a gate trench formed in the substrate;
a gate barrier pattern disposed on a lower portion of the gate trench;
a gate electrode pattern formed on the gate barrier pattern and filling the lower portion of the gate trench;
a buffer oxide layer formed on the gate electrode pattern;
a silicon nitride layer formed on the buffer oxide layer to fill the upper portion of the gate trench,
wherein the gate barrier pattern has a top surface which is lower than a top of the gate electrode pattern;
an electrode protection layer conformally formed on a lower portion of the buffer oxide layer; and
a gate insulating layer covering outside wall of the gate barrier pattern and side wall of the buffer oxide layer,
wherein a portion of the electrode protection layer is disposed between the gate insulating layer and the gate electrode pattern.

14. The semiconductor device of claim 13, wherein a bottom surface of the electrode protection layer is in contact with an upper surface of the gate barrier pattern.

15. A semiconductor device, comprising:
a device isolation region defining an active region in a substrate;
gate structures buried in the active region of the substrate;
a bit-line contact plug formed on the substrate to be vertically aligned with the active region between the gate structures; and
a bit-line structure formed on the bit-line contact plug,
wherein each of the gate structures comprises:
a gate trench formed in the substrate;
a gate barrier pattern disposed on a lower portion of the gate trench;
a gate electrode pattern formed on the gate barrier pattern and filling the lower portion of the gate trench;
a silicon oxide layer formed on the gate electrode pattern;
a gate capping insulating layer formed on the silicon oxide layer to fill the upper portion of the gate trench; and
an electrode protection layer conformally formed on a lower portion of the buffer oxide layer,
wherein an upper end of the gate barrier pattern is recessed to be lower than an upper end of the gate electrode pattern, and
wherein a bottom surface of the electrode protection layer is in contact with an upper surface of the gate barrier pattern.

16. The semiconductor device of claim 15, wherein the active region comprises:
a source area disposed between the gate structures; and
drain areas disposed between the device isolation region and the gate structures,
wherein the source area, and the drain areas include N-type dopants.

17. The semiconductor device of claim 15, wherein the silicon oxide layer includes phosphorus (P).

* * * * *